United States Patent
White et al.

(10) Patent No.: US 7,112,789 B2
(45) Date of Patent: Sep. 26, 2006

(54) HIGH ASPECT RATIO, HIGH MASS RESOLUTION ANALYZER MAGNET AND SYSTEM FOR RIBBON ION BEAMS

(76) Inventors: Nicholas R. White, 9 Spy Rock Hill, Manchester, MA (US) 01944; Jiong Chen, 1069 Oaktree Dr., San Jose, CA (US) 95129

(*) Notice: Subject to any disclaimer, the term of this patent is extended or adjusted under 35 U.S.C. 154(b) by 0 days.

(21) Appl. No.: 11/123,924

(22) Filed: May 6, 2005

(65) Prior Publication Data

US 2005/0258380 A1 Nov. 24, 2005

Related U.S. Application Data

(60) Provisional application No. 60/571,965, filed on May 18, 2004.

(51) Int. Cl.
*H01J 37/317* (2006.01)
*H01J 37/147* (2006.01)
*H01J 49/20* (2006.01)

(52) U.S. Cl. ............ 250/294; 250/298; 250/299; 250/492.21; 335/210; 335/213

(58) Field of Classification Search ............ None
See application file for complete search history.

(56) References Cited

U.S. PATENT DOCUMENTS 5,393,984 A * 2/1995 Glavish .......... 250/396 ML

* cited by examiner

*Primary Examiner*—Nikita Wells
(74) *Attorney, Agent, or Firm*—David Prashker

(57) ABSTRACT

The present invention provides a windowframe magnet having an aligned array of paired bedstead coils in mirror symmetry can bend a high aspect ratio ribbon ion beam through angle of not less than about 45 degrees and not more than about 110 degrees, and can focus it through a resolving slot for mass analysis. The long transverse axis of the beam, which can exceed 50% of the bend radius, is aligned with the generated magnetic field. The array of paired bedstead coils provide tight control of the fringing fields, present intrinsically good field uniformity, and enable a manufacture of much lighter construction than other magnet styles conventionally in use in the ion implantation industry.

Within the system of the present invention, the ribbon beam is refocused with low aberration to achieve high resolving power, which is of significant value in the ion implantation industry. System size is further reduced by using a small ion source and a quadrupole lens to collimate the beam after expansion and analysis. There is no fundamental limit to the aspect ratio of the beam that can be analyzed.

23 Claims, 8 Drawing Sheets

Cross section A-A'

HIGH ASPECT RATIO, HIGH MASS RESOLUTION ANALYZER MAGNET AND SYSTEM FOR RIBBON ION BEAMS

PRIORITY CLAIM

The present invention was first filed on May 18, 2004 as U.S. Provisional Patent Application Ser. No. 60/571,965 entitled "High Aspect Ratio, High Mass Resolution Magnet For Ribbon Beams". The priority of this first filing is expressly claimed pursuant to 35 U.S.C. 119(e).

FIELD OF THE INVENTION

The present invention is concerned generally with mass-analyzing ribbon shaped ion beams; and is directed specifically to novel high resolution magnets able to bend a high aspect ratio ribbon ion beam at a pre-chosen angle and focus the ion beam for mass analysis with high resolving power and high acceptance.

BACKGROUND OF THE INVENTION

In the field of ion beam systems, it is sometimes desired to generate purified ion beams in the form of ribbon-shaped beams. These ribbon beams are commonly used in ion implanter apparatus and implantation systems where a workpiece (such as a silicon wafer or flat panel display) is moved through the ion beam. In these instances, the ribbon ion beam will desirably have a high aspect-ratio such that the beam is wider than any size-dimension of the workpiece undergoing implantation; so, that in a single pass through the ion beam, a uniform dose of ions may be implanted onto a surface and into the internal substance of the workpiece. In the performance of these applications, it is also very desirable that the ribbon beam has its ion trajectories moving in parallel and be carefully controlled to present a uniform current density profile suitable for the uniform implantation of ions into silicon wafers or flat glass panels.

A. An Overview of the Technical Field and Commercially Sold Systems

It is long known that ion sources generally produce beams which typically include one or more undesirable species which are present in the ion source feed material and/or in the materials of the source itself. Thus, for many years it has been a standard practice in this industry to use magnetic analysis to separate and reject any unwanted species or components from these ion beams. However, for large ribbon-shaped beams generally and particularly for those beams of high Perveance, this type of magnetic mass analysis and ion beam purification has become ever-more difficult and costly.

It is noted that the term Perveance was originally defined as the constant G in the Child-Langmuir equation, $G = I/V^{3/2}$, which governs the current in a space-charged limited thermionic diode. For heavy ion beams, this equation must be generalized to take into account the ion mass and charge, and a more useful definition is therefore $$G = \sqrt{\frac{m}{q}} \cdot \frac{I}{V^{3/2}}.$$

where m is the ion mass, q is its charge, I is the beam current, and V the potential through which it has been accelerated.

This particular technical problem, as well as the general state of the art for analyzing and transporting ribbon ion beams, is reviewed in depth by White et al., "The Control Of Uniformity In Parallel Ribbon Ion Beams Up To 24 inches In Size", *Applications Of Accelerators In Science And Industry* 1998, AIP, p. 830, 1999, the entire text of which is expressly incorporated by reference herein.

The Commercial Systems Conventionally Sold Today:

Among the ion implanter apparatus and implantation systems commercially offered for sale today are those sold for ion beam implantation of flat panel displays (or "FPD's") by Nissin Ion Equipment Co. Ltd. (Kyoto, Japan), Sumitomo Eaton Nova Corporation (Toyo, Japan), and Ishikawajima-Harima Heavy Industries Co. Ltd. (Tokyo, Japan). These commercially sold systems have, in the past, constituted apparatus and ion beams with no or little ability to reject contaminant species that are almost always present in the beam as it leaves the ion source.

In contrast, Mitsui Engineering and Shipbuilding manufactures implantation apparatus and systems for commercial sale which are able to implant flat panel displays with uniform ribbon beams which have been mass analyzed using magnets having only modest resolving power (i.e., approximately 2 power)—which is often sufficient to remove the egregious specie contaminants from ion beams of several different, commercially useful source elements (See Prior Art FIG. 1, reproduced from U.S. Pat. No. 5,834,786).

Also Varian Semiconductor Associates Inc. manufactures ion implanters for the implantation of silicon wafers which, in contrast with the aforementioned implanters for flat-panel displays, is an apparatus that uses two different magnets to generate a suitable ribbon-shaped beam. The first magnet mass-analyzes the ion beam; and the second magnet renders the ions in the beam more parallel. The resolving power in this Varian two magnet system is as good as any other commercially available ion implanter can provide, and typically exceeds 80 M/ΔM FWHM. For this reason, this structural format—the two magnetic system—has become the de facto standard for ion beam uniformity and purity; and is the system against which all other ribbon-beam implantation systems are currently judged. Unfortunately however, this two-magnet system has severe drawbacks: it is complex and expensive; and is only manufactured to produce ribbon ion beams up to 300 mm in size (See Prior Art FIG. 2, reproduced from U.S. Pat. No. 5,350,926).

The Major Problems of Magnets Used for Mass Analysis:

A number of different problems are commonly recognized and known by practitioners working in this technical field for those magnets used for mass analysis. These include, but are not limited to, adequate resolving power; implantation system aberrations; a limited ability to transmit high perveance beams without beam blowup [due to plasma instability and/or loss of neutralization of space charge within the magnetized ion beam; see for example, Alexeff, I., "Instability Threshold for a Calutron (Isotope Separator) with only one Isotope Species," IEEE Transactions on Plasma Science, vol. PS-11, No. 2, 90–91 (1983)]; and a variety of other ion implanter system defects and deficiencies.

Adequate Resolving Power

It is generally accepted within the technical field of silicon wafer implantation systems that a magnet resolving power [i.e., the ability to separate and differentiate between ions of closely spaced magnetic rigidity] which is greater than 60 is optimal and desirable; and that magnets with a resolving power less than 60 (i.e., having poorer separation and differentiation capabilities) are considered to be routinely acceptable for use—if and when a tradeoff with productivity can be had. Thus, if magnets capable of directly outputting ribbon beams of suitable size and concurrently capable of analyzing with resolving power greater than about 30 were used in those implanters and systems commercially sold today for the flat panel display market, this would be both acceptable and desirable. However, it is noted that analyzer magnets having a resolving power greater than about 30 have only recently and imperfectly been introduced and utilized in such systems. Of these, only one commercially sold ion implanter apparatus for flat panel displays has a resolving power of more than 30; and it suffers from major drawbacks including a high power consumption, extreme weight, and stray magnetic fields, as described herein.

System Aberrations

As merely one representative example illustrating the broad problem of system aberrations, Nissin Ion Systems has recently commenced the manufacture of an apparatus for implanting flat panel displays which uses a single large bending magnet, and which achieves a higher magnet resolving power than was available in prior systems. In this Nissin system, the longer (width) dimension of the ribbon-shaped beam is determined by the size of the ion source; and the open spatial gap in the analyzing magnet (from North to South magnetic pole) across which the magnetic field must be developed is larger in size than the dimensions of the ion beam. Structurally, the Nissin analyzer magnet has a steel yoke which is substantially rectangular in configuration and cross-section; wire coils are wound around the sides of this rectangular yoke, more-or-less uniformly; and the wound coils are subdivided so that the current density may be varied as needed, and thereby control the uniformity of the magnetic field generated within the yoke (See Prior Art FIGS. 3a and 3b respectively, reproduced from U.S. Pat. No. 6,160,262).

One of the major difficulties of achieving high resolving power in a single magnet bending a ribbon beam is the very likely possibility of creating a serious second-order aberration, which will cause a distortion of the shape of the ion beam [see for example, the discussion of this problem in the White et al., AIP publication cited above]. The generation and presence of such a distortion has two resulting effects of major concern: one effect is to reduce the mass resolving power which can be obtained from the analyzer magnet. The other result is to compromise the effective aspect ratio of the beam through which the flat glass panel (or other workpiece) is scanned, thereby requiring a longer scan distance and reducing the implantation efficiency of the scan.

In view of these recognized system aberrations, Nissin has attempted to control these major drawbacks to a meaningful degree by employing wire coils of suitable height such that the coil current distribution extends uniformly along the sides of the high aspect-ratio ion beam. This is an extension of the concept known as a 'window-frame' magnet. However, while a 'window-frame' magnet can generate the required magnetic field internally within the yoke, it also concomitantly creates on the outside of the yoke structure a 'naked' dipole magnet, which produces a very strong fringing field capable of extending great distances from the magnet.

The problems Associated with Concomitantly Generating a 'Fringe Field'

Among the known drawbacks of concomitantly generating a strong 'fringe field' are: (i) safety and regulatory problems associated with the exposure of personnel to high magnetic fields, particularly for persons wearing pacemakers; (ii) the effects of the stray magnetic field on the performance of the ion source in the apparatus; (iii) the effects of the stray magnetic fields upon cathode ray tubes (which can be avoided by the use of flat-panel displays); and (iv) the effects upon system adjustments performed during the operation of sensitive electronics. In addition, the stored energy and the power consumption of a window-frame magnet (generating a fringe field) can be very great; and, in combination with the magnetic shielding required to abate these problems, the weight of the entire apparatus and system can become very great.

Accordingly, some attempts have been made in the past to overcome the stray magnetic field problem caused by fringing fields. For example, Benveniste has proposed the use of field clamps to control stray magnetic fields (See U.S. Pat. Nos. 6,770,888 and 6,835,930). This approach, however, is a conventionally known solution which was used in the past for many large aspect-ratio systems—notably in the Varian SHC-80 and VIISta-80 implanters, where the magnetic field clamps were adjusted in position to fine-tune the optical properties of the beam bending magnet. Also, the Benveniste method was utilized earlier in 1994 within the SHC80 ion implanter sold by Varian Associates; and similar use of field clamps has been practiced in many earlier ion beam systems.

In addition, some notable early technical publications have addressed the 'fringe field' problem directly. These printed publications include: The 1983 thesis written by Nicholas R. White at Oxford University, which provides several early examples; and the article by Harald Enge in Applied Charged Particle Optics, Ed A. Septier, Academic Press (1980), which not only describes the use of field clamps for controlling the extent of fringing fields in resolving magnets with uniform fields, but also gives a detailed analysis of the effects of such fringe fields on the focal properties of the magnets. Lastly, it is recognized that today the capability for controlling the effects of fringing fields is included into beam optics programs such as TRANSPORT as a parameter that can be adjusted.

Moreover, the fringe field is many more times more powerful and extensive in window-frame magnets of the type disclosed by Nissin and by Benveniste, because current carrying coils surround almost the entire magnet structure; the field clamp approach is therefore both more needed and more difficult to deploy effectively. More conventional magnet construction contains most of the current-carrying coils within the yoke.

B. An Optimally Designed Ribbon Beam High-Current Ion Implantation System

An Ideal High-Current Ion Beam Implantation System Design:

It would be most desirable to design an ion beam implantation system (comprising at least an ion source, an ion beam acceleration system, and an analyzing magnet), which provides the following functional capabilities and operating characteristics (each of which may be found individually in at least one of the earlier cited systems reviewed above).

(i) The desired system is capable of delivering a large ion beam of high aspect ratio and rectangular cross section; and, if the application demands it, of at least 800 mm in the longer dimension, (ii) The desired system magnetically deflects this ion beam through an angle of at least 45 and preferably 90 degrees, bending in the direction of the narrow beam dimension, and achieving thereby a resolving power greater than ~40. This requires tight control of $2^{nd}$-order aberrations, (iii) The magnetic field in the desired system is efficiently confined to the required region; and is rapidly attenuated outside this region (iv) The angular acceptance that the beam path through the magnet presents to the ion source in the desired system should be as large as possible to maximize the transmission, particularly of high perveance beams.

In addition, while meeting these initial objectives, it would be most desirable to also:

(a) Minimize the weight of the magnet system (including any required magnetic shielding);

(b) Minimize the power consumption of the coils;

(c) Reduce the required major dimension of both the magnet and the ion source, while maintaining the size and aspect ratio of the output beam; and (d) Simplify the construction of the system, and reduce the cost of its manufacture.

The Fundamental Problem of Creating a Ribbon Ion Beam Having a High Aspect-Ratio and a High Resolving Power for Mass Analysis:

It is also appropriate to review some of the reported efforts which have been made in the past to find a solution to the fundamental problem of generating a high aspect-ratio ribbon beam in an implantation system which provides a high resolving power for mass analysis. Over the years, a number of very different approaches have been attempted, with varying degrees of success.

Initially, at least two or more magnets were utilized in combination: The reported developments of interest include the following:

(1) In 1985, Douglas-Hamilton et al. disclosed a system [See U.S. Pat. No. 4,812,663] in which a generally circular beam (consisting of 7 or 13 beamlets) was mass-analyzed in a conventional analyzer magnet; then, shaped with a succession of quadrupole lenses to form a tall elliptical beam.

(2) In 1990, N. R. White disclosed a system [See U.S. Pat. No. 5,126,575] which used a strongly convergent beam to form a waist at the center of an analyzing magnet of conventional proportions—i.e., a pole gap <20% of bend radius and aspect ratio of the beam within the magnet close to unity. The ion beam was allowed to expand after leaving the magnet, and was finally collimated with a small sector magnet.

(3) In 1993, White et al. disclosed a system [See U.S. Pat. No. 5,350,926] which used two magnets: the first magnet achieved high resolving power in a beam that had high divergence from the resolving aperture (+/->6 degrees); and the second magnet formed the ions into a parallel beam. The short axis of the beam was aligned with the magnetic field.

Subsequently thereafter, innovative developments occurred using only a single magnet in the apparatus and system. These later efforts are exemplified and represented by the following:

(4) In 1995, White et al. disclosed a system [See U.S. Pat. No. 5,834,786] with a single magnet producing a parallel beam but having a low resolving power (about 2), in which the high aspect-ratio beam had its short axis oriented in the direction of the field.

(5) In 1998, N. R. White [AIP citation given above] reviewed the options for such systems and concluded that conventional dipoles (fields defined by discrete poles) would have aberrations which were too serious to allow an alignment of the long axis of a ribbon ion beam with the field.

(6) Also in 1998, Takahashi et al [Conference IIT-98, Kyoto, Japan, published by IEEE, 1999] disclosed the use of a 'window-frame' magnet with multiple coils wound around the legs of the yoke to provide a large aperture. Initially, this showed an aspect ratio close to unity; but the text of U.S. Pat. No. 6,160,262 discloses this particular design as being suitable for use with high aspect-ratio beams.

(7) Also in 1998, Aitken [IIT '98 conference, Kyoto, Japan, published by IEEE (1999) p.196;] disclosed a complicated system of transverse quadrupole lenses for achieving mass resolution in ribbon beams.

(8) About 2000, a private communication revealed that Kawasaki et al. designed a magnet in which the ion beam was passed in and out of the uniform field via parallel passages between conductors in a vertical array, thereby forming a boundary to control the 'fringe field' of a high aspect-ratio magnet.

(9) Lastly, U.S. Pat. No. 6,403,967 issued Jun. 11, 2002 to Chen et al. describes an analyzer magnet comprising bedstead coils, but which also incorporates a secondary pair of coils as part of its requisite structure. Furthermore, as disclosed therein, the articulated purpose and true goal of the Chen et al. structure is two fold in nature: (i) to provide a magnet having a strongly non-uniform magnetic field; and (ii) to provide an element of control to adjust the non-uniformity of the ion beam. The Chen et al. invention is thus designed and structured to maintain space-charge compensation in extremely high perveance beams. Also, it is noteworthy that the aspect-ratio of the ion beam passing through the Chen et al. magnet is disclosed as being unity.

Even by this short chronology and listing of events, it is apparent that major development initiatives and great efforts have been expended to find a relatively simple way of achieving high resolution analysis of a ribbon ion beam in an uncomplicated and compact system. Most of them have had some degree of operative success despite the many drawbacks and deficiencies existing within the reported techniques.

SUMMARY OF THE INVENTION

The present invention has multiple aspects and applications. One primary aspect provides a magnetic analyzer for separating unwanted ion species from a traveling ribbon ion beam, said magnetic analyzer comprising:

a central axis and intended arc pathway for a ribbon ion beam as it travels, said central axis having a curvilinear shape, an arc with a radius ranging between about 0.25 and 2 meters, and an angle of curvature ranging from not less than about 45 degrees to not more than about 110 degrees of curvature;

an arcuate yoke construct encompassing said predetermined curvilinear central axis and surrounding said intended arc pathway for the continuous ribbon ion beam as it travels, said arcuate yoke construct being formed at least in part of a ferromagnetic material and comprising an arcuate wall structure having fixed dimensions and a substantially rectangular cross-section, two discrete open ends which serve as an entrance and exit for the traveling beam, and an internal spatial region of determinable volume which serves as a spatial passageway for the traveling beam;

a mirror symmetrical pair of loop-shaped coils set in parallel as an aligned array, (a) wherein each discrete coil of the pair in the aligned array (i) is an elongated complete loop comprised at least in part of electrically conductive material, (ii) is an elongated complete loop having two rounded and inclined discrete loop ends, each of which is bent in the same direction, and (iii) is an elongated complete loop formed as a set of multiple conductive segments placed in sequential series wherein each segment lies at a pre-chosen sequence position and individual angle orientation with respect to the central axis and intended arc pathway for the ribbon ion beam as it travels within said internal spatial region of said arcuate yoke construct, and (b) wherein the aligned array of two looped-shaped coils set in mirror symmetry (iv) presents a bend direction for the two rounded inclined ends of one looped-shaped coil which is opposite to the bend direction for the two rounded inclined ends of the other looped-shaped coil in the pair, (v) provides a central open spatial channel via the cavity volume of the closed loop in each of the two coils, said central open spatial channel extending from each pair of inclined rounded loop ends to the other over the linear dimensional distance of the array, (vi) is positioned within said internal spatial region along the interior surfaces of two opposing walls of said arcuate yoke construct such that one pair of oppositely bent inclined loop ends extends from and lies adjacent to each of the two open ends of said arcuate yoke construct, (vii) serves as limiting boundaries for said curvilinear central axis and intended arc pathway for the continuous ribbon ion beam as it travels in the gap space between said two loop-shaped coils after being positioned within said internal spatial region of said arcuate yoke construct.

A second aspect of the present invention provides an ion source with a slotted aperture for forming a ribbon beam, the beam diverging from it in two dimensions. A magnet as described above bends the ribbon beam through an angle between 45 degrees and 110 degrees, and provides focusing in the direction in which the beam is bent, but little or no focusing in the direction of the magnetic field. As a result, the ion beam leaving the magnet is focused to a line focus of high aspect ratio.

A lens positioned about the beam near this focus generates a quadrupole magnetic field which provides focusing to cause trajectories diverging in the direction of the long axis of the ion source slot to become approximately parallel. A target may be passed through the parallel beam so generated, thereby implanting across its face a dose of ions with little or no variation in incident angle of the ions across said surface.

A further aspect of the invention provides, in addition to the foregoing, a multipole lens positioned about the beam near the entrance or exit of the magnet, allowing the uniformity of the ribbon beam in its longer direction to be controlled.

According to another aspect of the invention, the arcuate steel yoke bounding the ion beam deviates from rectangular cross section, and the distance between the bounding steel surfaces varies with the distance along the curvilinear beam axis, conforming to the desired expanding size profile of the ion beam as it passes through the magnet. Since the gap varies, the magnetic field is not constant, and the curvature of the beam axis varies along its length.

An additional aspect of the invention provides for curving the profile of the bounding steel surfaces, and curving the entrance and exit edges of the steel yoke, so as to minimize distortions and aberrations in the shape of the ion beam.

DETAILED DESCRIPTION OF THE INVENTION

Figure 1:
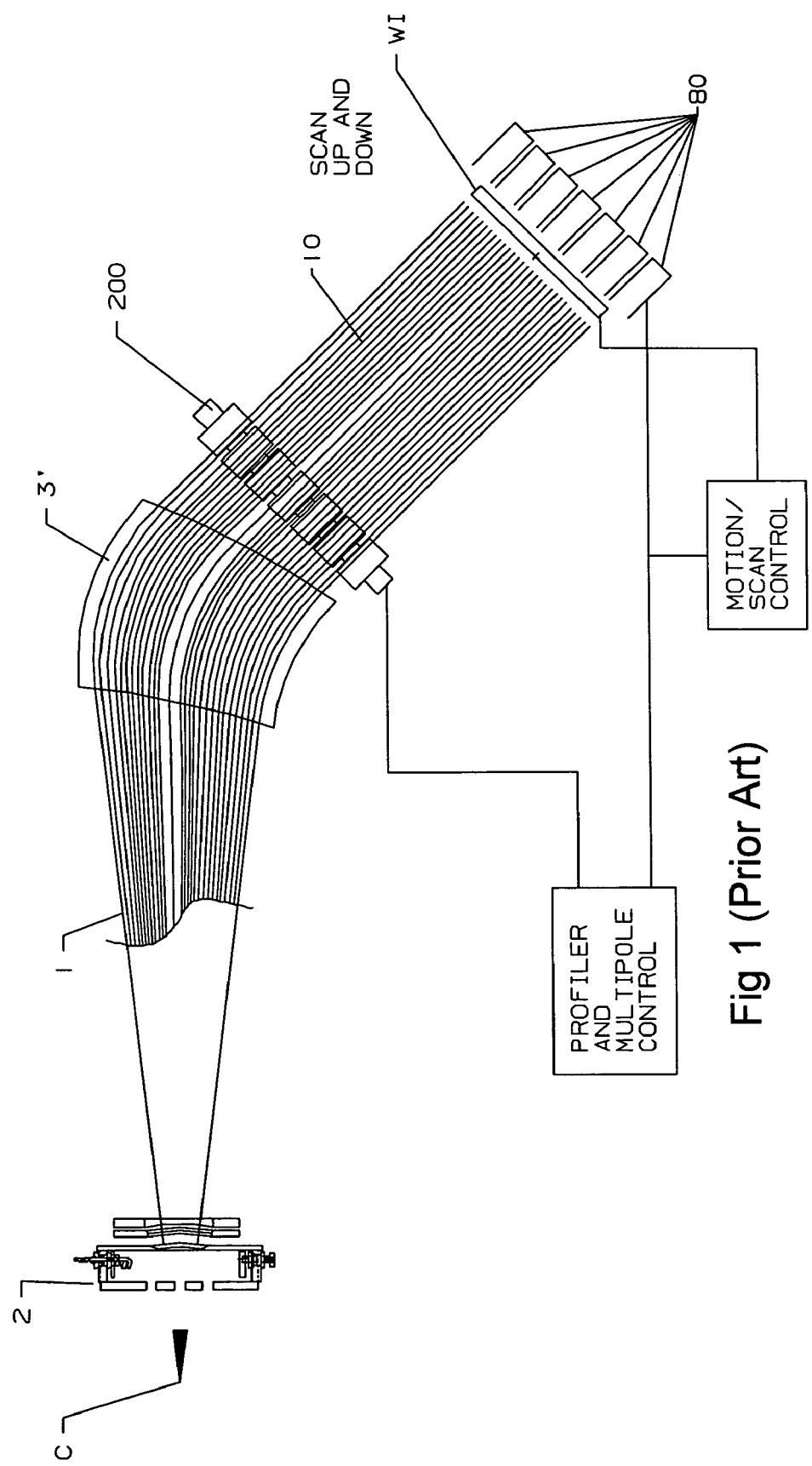
FIG. 1 is reproduced from U.S. Pat. No. 5,834,786 and shows a prior art single magnet ribbon beam implanter having a resolving power of ~2.
Figure 2:
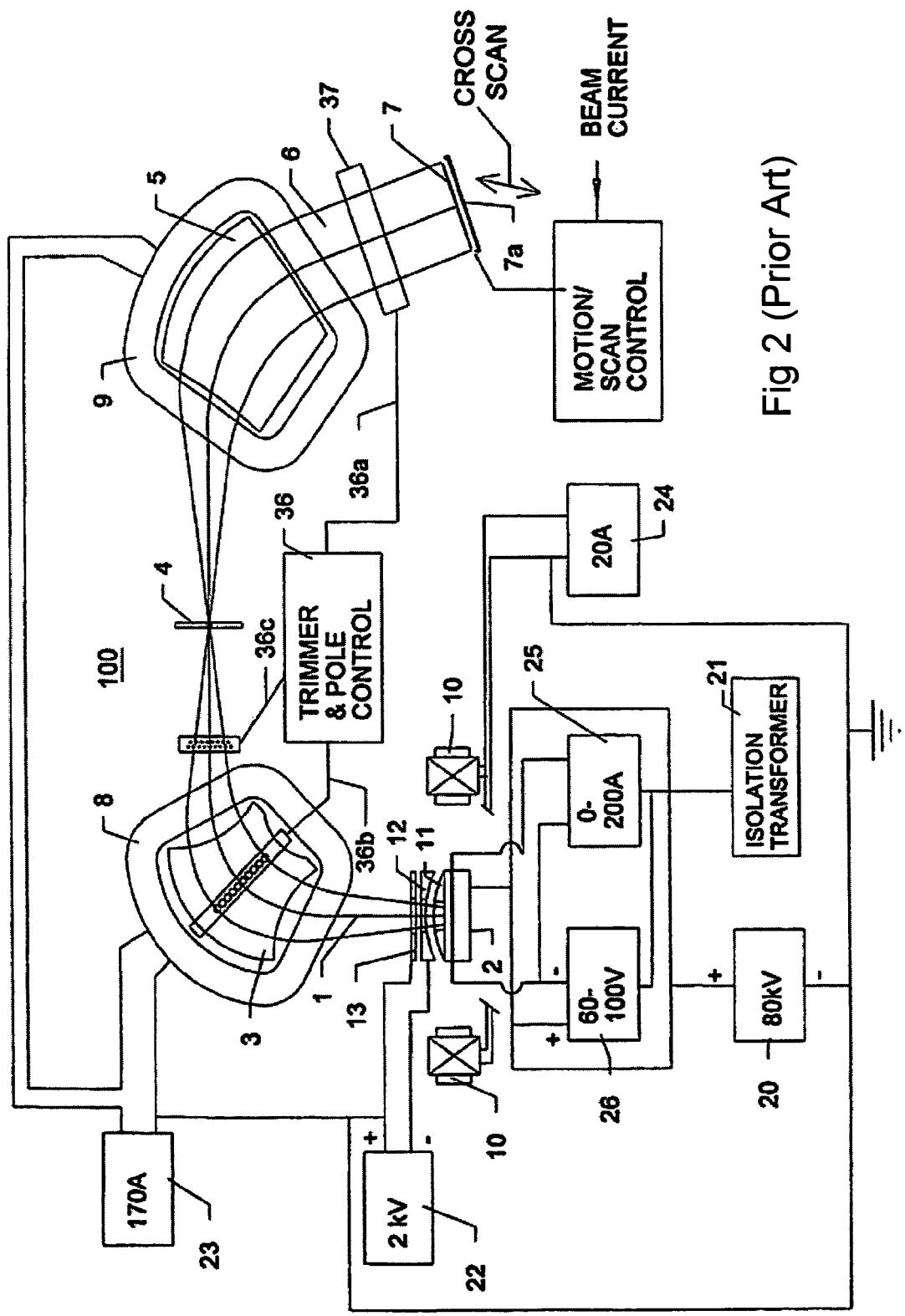
FIG. 2 is reproduced from U.S. Pat. No. 5,350,926 and shows a prior art two magnet system having a resolving power of >60.

I. The Subject Matter as a Whole Comprising the Present Invention

In its simplest form, the present invention comprises an analyzer magnet having a pair of aligned bedstead coils formed as an array; is able to bend a high aspect-ratio ribbon ion beam through an angle of at least 45 degrees and up to an angle of about 110 degrees; and can focus the ribbon beam such that the desired ion components pass through a resolving slot while the unwanted ion components are not transmitted, so as to provide mass analysis. Also, the long transverse axis of the ribbon ion beam can exceed 50% of the bending radius and this axis is aligned with the magnetic field generated by the analyzer magnet.

A pair of bedstead coils is placed in mirror-symmetry as an aligned array; carries electrical current within the analyzer magnet structure; and generates a magnetic field characterized by intrinsically good field uniformity and well-contained fringe fields (essentially zero except in the region where the beam enters and exits). The aligned array of paired bedstead coils allows the manufacture of a much lighter construction for the apparatus than has been possible previously with other magnets conventionally used today in ion implantation systems.

Via the present invention, the ribbon ion beam is refocused with low aberration to achieve a high resolving power, which is of substantive value in the ion implantation industry. Also, the size of the implantation system can now be markedly reduced by using a small ion source and a quadrupole lens to collimate (render parallel) the trajectory pathways of the ribbon ion beam after expansion and mass analysis (purification). Finally, and equally importantly, there is no effective limit to the aspect-ratio of the beam that can be mass analyzed.

In any of its more sophisticated and complex embodiments, the present invention provides an ion beam implantation apparatus and implantation system (comprising at least an ion source, an acceleration system, and a window-frame magnet having a pair of bedstead coils as an analyzing magnet) which provides a range of unusual advantages and a variety of previously unavailable benefits.

Among these substantive advantages and benefits are the following features, functions, operating parameters and overall characteristics:

1. The present invention is capable of delivering a large ion beam of high aspect ratio and rectangular cross section, of at least 800 mm in the longer (height) dimension, which is suitable for the implantation of large flat panel displays, as well as for implanting silicon wafers of 300 mm diameter.

2. The present invention magnetically deflects a ribbon ion beam through an angle of at least 45 degrees, and preferably at about 90 degrees; and bends the beam in the direction of the beam's shorter (width) dimension, thereby achieving a resolving power greater than ~40. This capability and achievement requires the careful and precise control of $2^{nd}$-order aberrations.

3. The present invention generates a magnetic field which is efficiently confined to the designated spatial passageway region within the yoke interior through which the ribbon ion beam passes, and which becomes rapidly attenuated outside this designated spatial passageway region.

4. The present invention minimizes the weight of the entire analyzer magnet system (including any required magnetic shielding).

5. The present invention minimizes the power consumption of the wound wire coils disposed within the structure of the analyzer magnet.

6. The present invention reduces the requisite size dimensions for both the analyzer magnet and the ion source, while maintaining the desired width-dimensional size and high aspect-ratio of the output ribbon ion beam.

7. The present invention simplifies the construction and size of the high aspect-ratio ribbon ion beam implantation system as a whole, and also markedly reduces the cost of its manufacture.

II. The Technical Underpinnings of the Present Invention

A. In the commercial ion beam industry as a whole, it has become usual to manufacture magnets with wire coils that are built up of planar layers. The wire coils are disposed around ferromagnetic (typically steel) pole pieces located on either side of the traveling ion beam. The spatial distance (magnetic) gaps between the steel poles of the dipole magnets generally are less than 25% of the radius at which the beam is bent; and under these conditions, the steel pole pieces provide a convenient and effective means of shaping the magnetic field generated by the magnet.

Pole surfaces are frequently non-planar in order to shape the magnetic field for the purpose of controlling aberrations. However, the planar layers of wire coils disposed on the non-planar pole surface are typically of simple shape and are generally not close enough to the traveling ion beam to serve as a primary means of controlling aberrations. Thus, when the magnetic gap of a beam bending magnet exceeds 20 to 25% of the bend radius, it becomes very difficult to control the shape the field, and thereby to control aberrations by means of the steel poles alone.

Second-order aberrations typically cause growth (an increase) in the width of the beam focus; and often cause the ribbon beam's cross-sectional appearance to become bowed into a 'smile' shape distortion. Higher-order aberrations can cause even worse curved or arched configurational distortions at the beam extrema. In addition, these kinds of aberrations will cause marked deviations in the current density (uniformity) of the ion beam along its longer transverse (height) dimension.

B. The present inventor rests on the realization that a more complex coil shape provides great advantages in controlling the shape of the magnetic field generated by an analyzer magnet, a structural premise which is vital when the pole spatial gap exceeds about 50% of the bending radius. The other advantages of a more complex coil shape include: simplification of the manufacture of the ferromagnetic yoke; and a substantial overall reduction in mass of the system. There are also some disadvantages in forming a more complex coil shape; these lie primarily in the expense of the coils' manufacture, but are clearly outweighed by the advantages.

Figure 5:
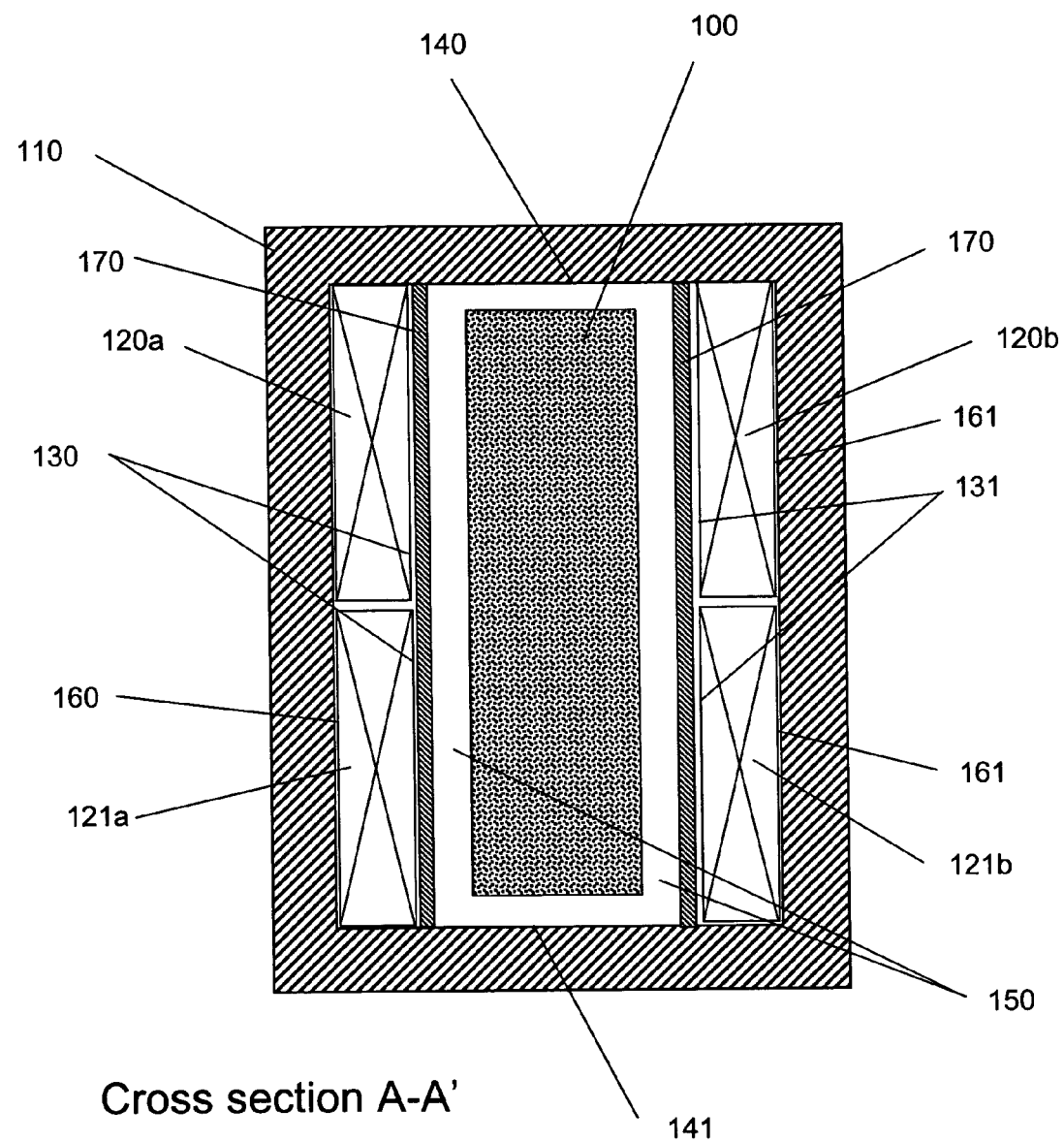
FIG. 5 shows a cross-sectional view of the present invention, as seen along the beam's direction, along the axis AA' of FIG. 4.
Figure 6:
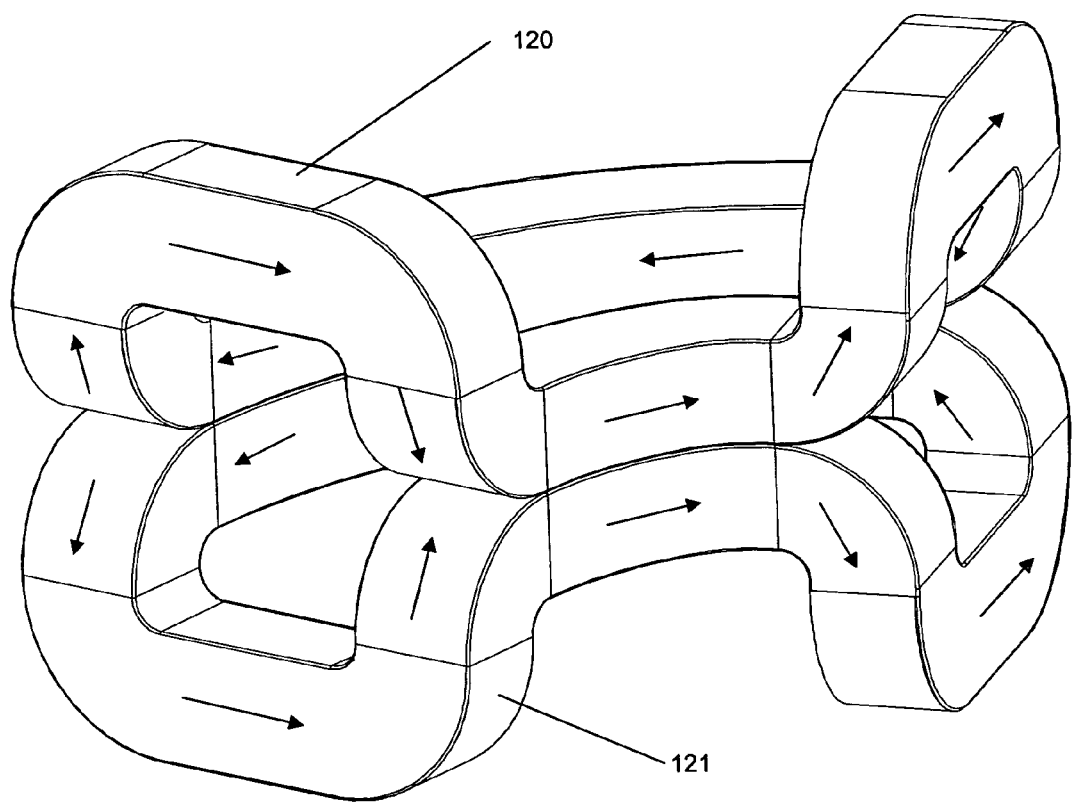
FIG. 6 shows a perspective view of a pair of curved bedstead coils employed in the present invention of FIG. 4.

Accordingly, the analyzer magnet of the present invention therefore uses a pair of precisely positioned and angle oriented bedstead coils, aligned in mirror symmetry as an array (as shown by FIGS. 5 and 6 herein) to define and control the entire magnetic field generated by the magnet. Each bedstead coil in the aligned pair has been individually manufactured using conductor material which is wound along a three-dimensional path. In addition, each coil in the aligned pair exists as a closed loop or oval structure; is formed by and is the result of a set of multiple segments joined in sequential series; and each individual segment in the set is fixed in sequence at a pre-chosen individual sequence position and angle orientation with respect to the intended curvilinear axis of travel for the ribbon ion beam. Accordingly, the segments positioned at each of its two rounded ends in the loop-shaped coil structure are inclined or curved at pre-chosen angles; and the precise angle orientation of the rounded segments constituting these inclined ends produces the overall bedstead shaped appearance.

The bedstead coils in the aligned array are placed in mirror symmetry and are employed together as a reciprocally matched pair to generate the desired magnetic field within the interior of the magnet. This structural arrangement is illustrated by FIG. 6.

C. The geometry used in the representative prior art system shown by FIGS. 3a and 3b respectively herein produces a magnetic field which has the desired uniformity in the region encompassed by the steel yoke, but the stray magnetic effects concomitantly produced outside the yoke are very different from the present invention.

Figure 3A:
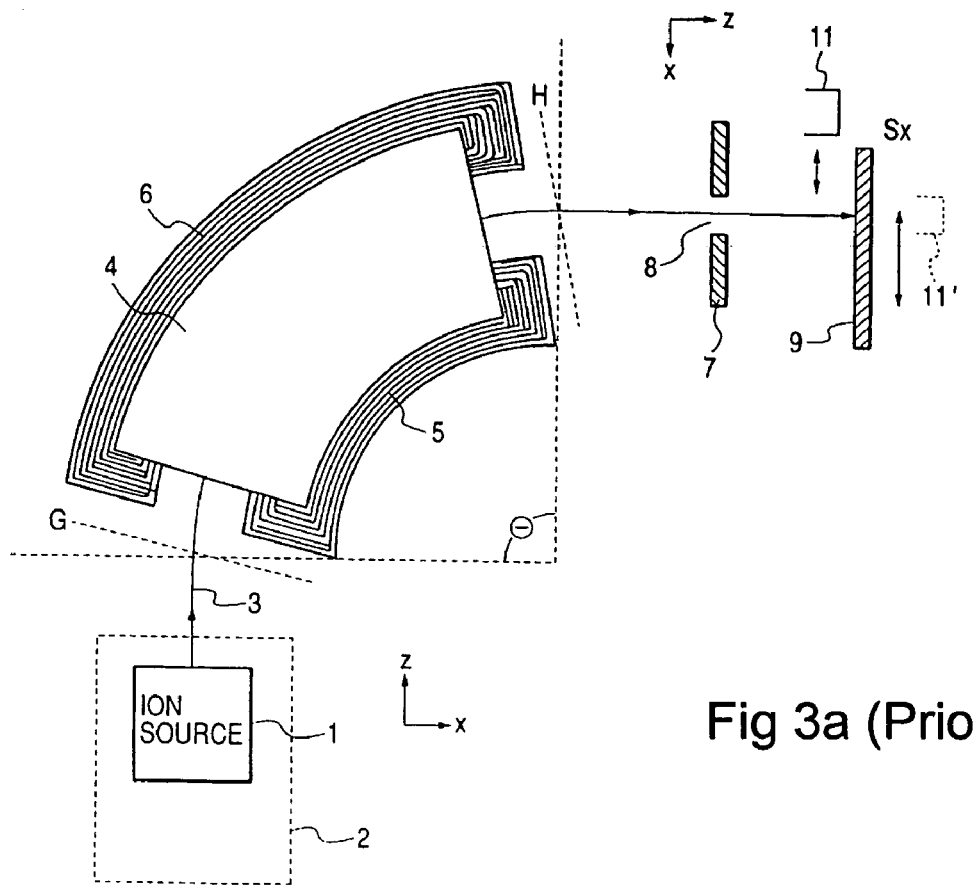
FIG. 3a is reproduced from U.S. Pat. No. 6,160,262 and shows a top view of a prior art 'windowframe' magnet ribbon beam system having a large pole gap and reasonable magnetic resolving power.
Figure 3B:
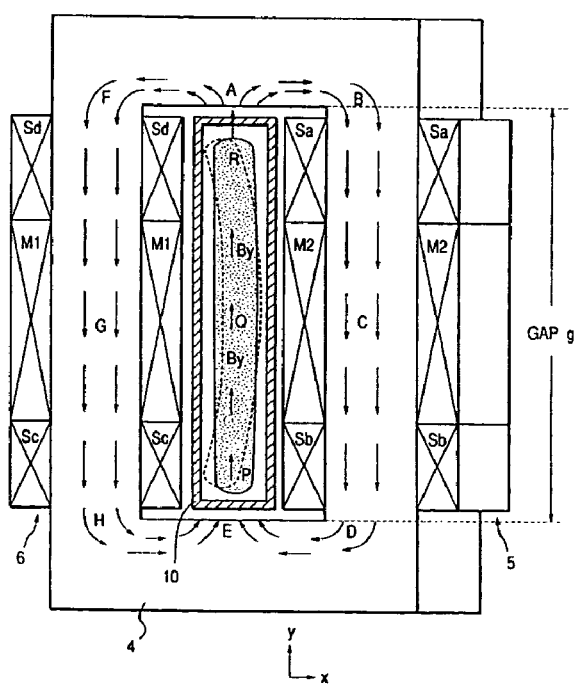
FIG. 3b is reproduced from U.S. Pat. No. 6,160,262 and shows a cross-sectional view of a prior art 'window frame' magnet, as seen along the direction of the beam.

Also, in the prior art systems exemplified by FIGS. 3a and 3b, it is commonly recognized that where the ion beam enters and exits the spatial gap in the steel yoke, it is impossible to simply connect a segment of the coil lying at one side of the yoke to the appropriate segment of the coil on the other side of the yoke, and then allow an electric current to circulate directly between them—because the electrical connections joining these coils together as a conductive pair would then physically block the beam from traveling therethrough and prevent the beam's passage through the spatial gap of the yoke.

Figure 7A:
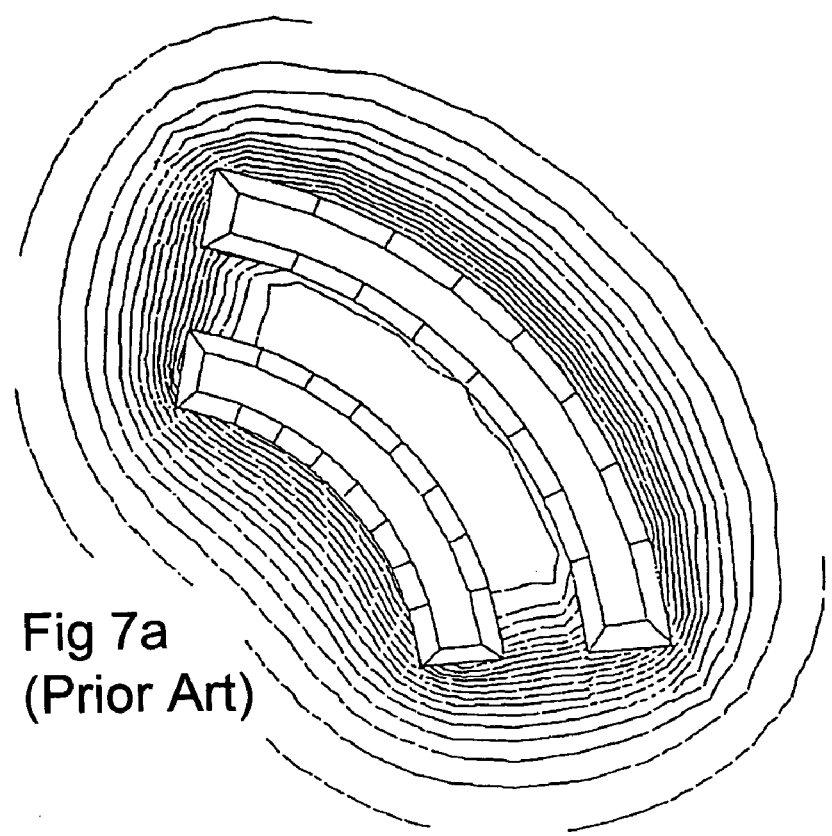
FIG. 7a is reproduced from U.S. Pat. No. 6,160,262 and shows a section of a prior art magnet and the extensive fringing field.

Thus, to solve this problem, the prior art structure shown by FIG. 3a uses a return path for the conductors 5 which are positioned outside the right-hand leg of the steel yoke 4; and uses a return path for the conductors 6 which is located outside the left leg of the steel yoke. [Please note that the reference numbers in FIG. 3a are reproduced from U.S. Pat. No. 6,160,262 of Aoki et al. and differ from those reference numerals used for the present invention herein]. However, the magnetic field generated by this return conductor is undesirable and its location can be problematic. This undesirable stray magnetic field is illustrated by FIG. 7a.

Another and different prior art solution to resolving this same problem has been to use thin sheets of conductor material at the coil ends to join them together, with large gaps in between through which significant amounts of beam can pass unobstructed. The drawback to this approach is that significant amounts of beam are intercepted by the edge of the thin conductor.

D. The present invention uses an entirely different technique for creating an electrical circuit and linkage between the two individual conductive coil segments, as illustrated by FIGS. 5 and 6.

As seen therein, the segments forming a first sector 120a of an upper inclined rounded end of the loop-shaped coil 120 are curved upwards and extend across and over the top of the beam as it travels through the spatial gap of the yoke; and this first sector 120a of the upwardly curved rounded end is structurally connected to and electrically joined to the segments forming a second sector 120b of the inclined rounded end. This connection forms a first direct electrical linkage between the two sectors 120a, 120b for the segments positioned in sequential series and results in an inclined rounded end for the looped-shaped coil 120. This construction is identical for the other rounded end of the coil 120, thereby completing a circuit for the loop-shaped coil 120 as a whole.

The situation is similar, but in directionally-opposite mirror symmetry, for the loop-shaped coil 121. The segments forming a first sector 121a of an downwardly inclined rounded end of the coil 121 are curved downwards and extend across and under the bottom of the beam as it travels through the spatial gap of the yoke; and this first sector 121a of the downwardly curved rounded end is structurally connected to and electrically joined to the segments forming a second sector 121b of the inclined rounded end. This connection forms a first direct electrical linkage between the two sectors 121a, 121b for the segments positioned in sequential series and results in an inclined rounded end for the loop-shaped coil 121. This construction is repeated for the other downwardly inclined rounded end of the coil 121, thereby completing a circuit for the loop-shaped coil 121 as a whole.

This construction results in a somewhat complicated arcuate shape for each of the two oppositely inclined coils in the aligned array, as is shown by FIG. 6. In practice, several tens or hundreds of turns of a conductor are wound on a path contained within the segments forming the sectors in the loop-shaped coil, and two leads are provided for connecting a source of current to this coil.

The overall result of this architectural arrangement and structure is unique in both form and function; and the topological resemblance for each of the two extended curved sectors comprising each of the two inclined rounded ends for each of the loop-shaped coils 120, 121 to the curved metal ends of an old brass bedstead has justifiably given rise to its more-commonly used descriptive title and short-form name as a 'bedstead coil' in the overall arcuate yoke architectural arrangement.

In this manner, a pair of bedstead-shaped coils formed of conductor is in mirror symmetry as an aligned array; and this array of two loop-shaped coils is placed within the interior of the yoke construct, one closed coil loop resting above the other in mirror symmetry at the mid plane of the ion beam axis of travel. These two coils forming the array pair may be electrically connected in series and be connected to a single source of current; or each individual bedstead shaped coil may be independently and individually connected to its own source of electric current.

Figure 7B:
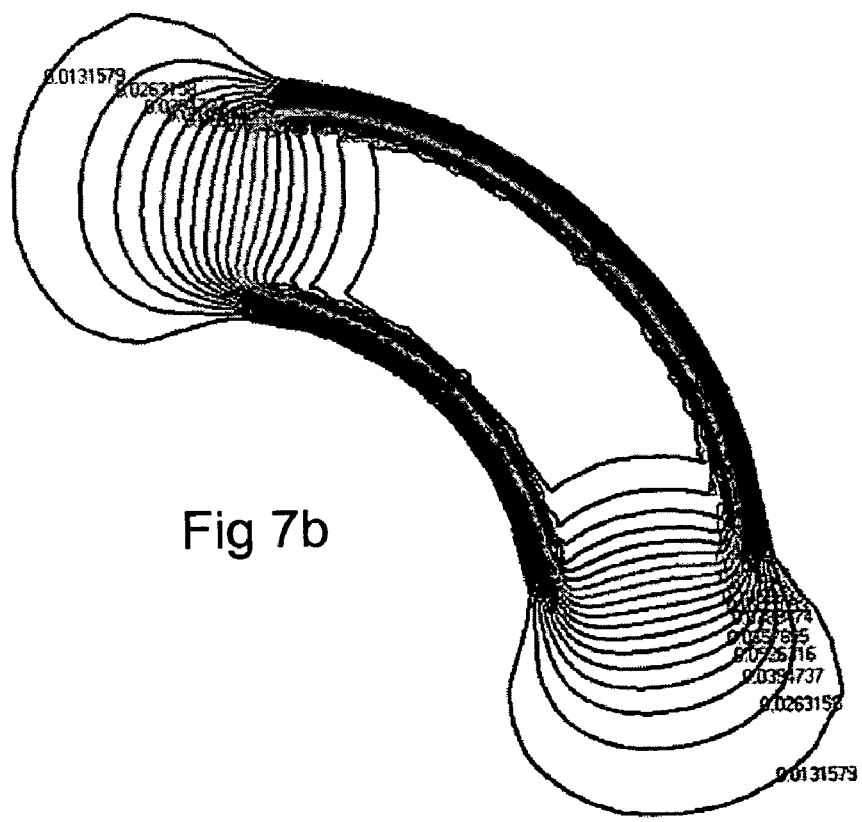
FIG. 7b shows a section of the present invention, as an embodiment of the same size as FIG. 7a, but illustrating a much smaller and contained fringing field.

E. Since the length of each of the two discrete coils, one of which extends over and one under the traveling ion beam, is less than the sum of the distances around the perimeters of the inner and outer walls of the arcuate yoke in the magnet structure, an often-cited advantage of 'bedstead coils' is their ability to use less copper content in their manufacture and provide a reduction in electrical power requirements. These advantages are quite real in value, but there are several more significant advantages to be had in this context:

1. In the prior art structure shown by FIGS. 3a and 3b, the conductors returning outside the yoke generate additional flux within the steel yoke. In fact, they generate approximately double the flux in the sidewalls. Therefore, to avoid saturation, the prior art magnet must have at least twice the thickness of steel in the sidewalls of the yoke, compared with the present invention. The present invention therefore reduces the required weight of steel.
2. The magnetic field generated by the external conductors extends a great distance. It typically appears as a large dipole. The field from an unshielded magnetic dipole falls at large distances (relative to the dipole dimensions) in proportion to the cube of the distance from the magnet. In contrast, the magnetic field falling outside the structural yoke of the present invention is almost zero in value, and constitutes only the smallest field caused by the finite permeability of the steel material itself. The external magnetic fields created by the prior art magnet of FIGS. 3a and b are illustrated by FIG. 7a. In comparison, FIG. 7b shows the external magnetic field of the present invention. Note that there are external fields extending along the beam path of generally similar magnitude in the two cases. In comparison, however the bedstead coil ends of the present invention help to attenuate the field at a distance, which resembles a sextupole field and falls with the fifth power of distance. The present invention requires no shielding, saving significant weight.

III. Preferred Embodiments and Systems Comprising the Present Invention

The subject matter as a whole comprising the present invention achieves all the above-listed advantages and benefits using a single dipole magnet, and optionally includes one or more focusing lens as an aid. The various formats and embodiments, simple or sophisticated, are described in detail below.

A First Preferred Embodiment.

Figure 4:
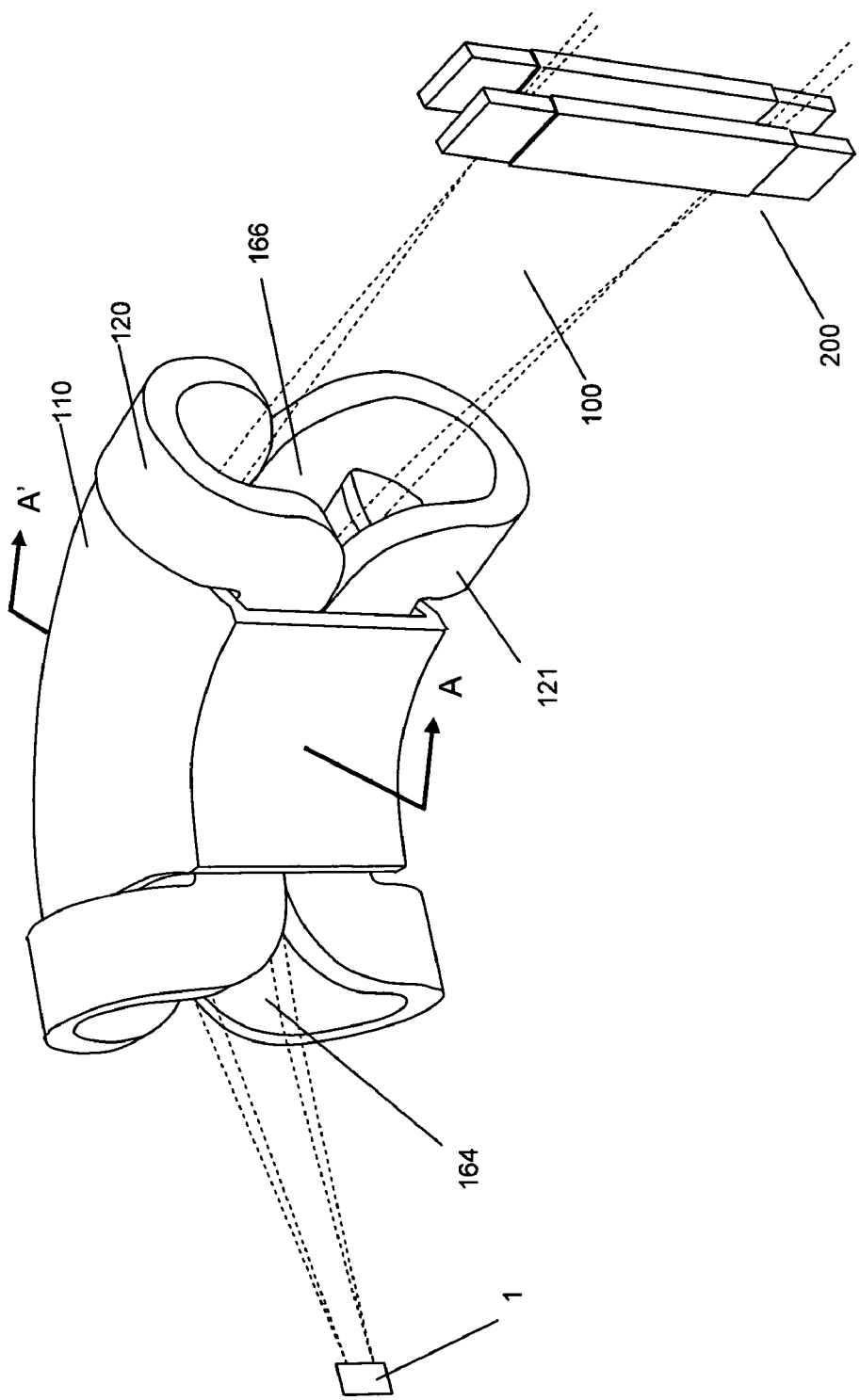
FIG. 4 shows a perspective view of the present invention as a simple embodiment having high resolving power and using an open Panofsky quadrupole lens to create a tall parallel beam.

A first preferred format for the present invention is illustrated by FIGS. 4, 5 and 6. As seen therein, a single deflection magnet bends the ribbon-shaped ion beam through an angle of at least 45 and preferably less than 110 degrees. The ferromagnetic yoke of the dipole magnet is essentially rectangular in overall cross-sectional appearance; although the true shape of the yoke may be slightly modified to enhance the ion optics, as will be described later herein.

A. The Axis and Intended Pathway for the Traveling Ribbon Ion Beam

For descriptive purposes, it is presumed that the major beam axis is vertical, and that the beam is traveling horizontally. The intended pathway of the center of the beam is referred to as the desired "beam axis"; and the "beam axis" comprises a first straight section, a curved section and a second straight section. This curvilinear beam axis lies in a plane, the midplane of the intended pathway.

Clearly, the beam axis provides the intended pathway over which the traveling ribbon ion beam moves as it passes through the interior spatial volume of the yoke construct in the analyzer magnet. The beam pathway will center upon and lie in the mid-plane, the midplane containing the curvilinear axis at the center of the ribbon ion beam as it travels within the arcuate yoke; and this pathway will be substantially an arc having a radius ranging between about 0.25 and 2 meters. Lastly, the ribbon ion beam will desirably have a high aspect-ratio as it travels along the beam axis.

B. The Ferromagnetic Arcuate Yoke Construct

A ferromagnetic arcuate yoke construct 110 is positioned to center on the intended beam axis and travel pathway, and be of sufficient dimensions and arcuate configuration to provide an arc having a radius of about 1 meter. In the views provided by FIGS. 4, 5 and 6, the arcuate yoke construct comprises a top wall 140, a bottom wall 141, and two sidewalls 160, 161; and also includes two discrete open ends 164, 166, which serve as an entrance to and exit from the internal spatial volume 150 of the yoke interior.

The Disposition of the Coils in the Arcuate Yoke Construct:

The disposition is best illustrated by FIGS. 4 and 6 respectively. Disposed within the internal spatial volume 150 and extending from the both entrance and exit openings 164, 166 of the arcuate yoke construct are a mirror-symmetrical, aligned array of individual loop-shaped coils 120 and 121. Each loop-shaped coil 120, 121 in the aligned array is a completely closed loop or oval of conductive material; and is a coil where the two respective ends of an individual closed loop are inclined in the same direction (either upwardly or downwardly).

Each loop-shaped coil is formed as a set of multiple conductive segments in sequential series; and each individual segment in the set is fixed in sequence at a pre-chosen individual sequence position and angle orientation with respect to the intended curvilinear axis of travel for the ribbon ion beam. Thus, the segments positioned at each of its two rounded ends in the looped-shaped coil configuration are inclined or curved at pre-chosen angles relative the beam axis; and the precise angle and orientation of the segments constituting these inclined loop ends of the coil produces the overall bedstead appearance.

Note also that the aligned array of paired coils provides a central open spatial channel via the cavity volume of the closed loop in each of the two coils; and this central open spatial channel extends from each pair of inclined rounded loop ends to the other over the linear distance of the array. By this structural arrangement, the central open spatial channel of the array assembly becomes the structural means for limiting and containing the beam axis and intended travel pathway of the ribbon ion beam.

Accordingly, the aligned array as an integrated entity and each loop-shaped coil of the arrayed pair is set in place upon and may be attached to an inside surface of a sidewall 160, 161 in the arcuate yoke; and a portion of each loop-shaped coil 120, 121 of the aligned array is positioned to rest on opposite sides of the mid-plane of the arcuate yoke in mirror-symmetry, the midplane containing the curvilinear axis at the center of the ribbon ion beam as it travels. This is well illustrated by FIG. 4.

The loop-shaped coils 120, 121 extend orthogonally from, and are in close proximity to the inner and outer sidewalls 160 and 161 of the arcuate yoke 110. Note also, that these yoke sidewalls are illustrated in FIG. 4 as being slightly curved, but for economy may be fabricated from straight sections with no compromise to the field uniformity in the vicinity of the ion beam.

The Beam-Limiting Boundary Limits of the Arcuate Yoke Interior:

The rectangular cross-sectional area of each conductive coil in the aligned pair may be of high aspect-ratio, as shown in FIGS. 4 and 5, the longer dimension of each coil in the paired array being approximately equal in size to one-half the longer dimension of the beam it is intended to encompass. However, as seen in FIG. 6, the same general format may be used with wider individual coils of low aspect ratio, depending on the specific ion beam shape and magnetic rigidity.

In this manner, each of the conductive coils 120, 121 in the paired array carry similar or identical electric currents and form two current-carrying limiting boundaries, one on either side of the beam traveling within the spatial gap 150 of the yoke construct. This architectural arrangement is shown in FIG. 5 as the side boundary limit 130 and the side boundary limit 131 surrounding the traveling ribbon ion beam.

In addition, the top wall 140 and bottom wall 141 of the arcuate steel yoke 110 are typically curved in configuration and provide two other beam-limiting boundaries 140 and 141, thereby, defining a centrally located, spatial gap 150 through which the rectangular-shaped volume zone of the ribbon ion beam 100 passes. The electric current in the curved conductive coils 120 and 121, within the architectural boundary limits created by the arcuate steel yoke 110, generates a substantially uniform magnetic field within the interior of the arcuate steel yoke framework which is orthogonal to the direction of beam travel and is aligned with the beam's pathway through the arcuate yoke. This generated magnetic field acts to bend the desired ion species in the beam into the intended arc-shaped pathway, while contaminant ion species are deflected along a different routing for subsequent removal.

The Limited Boundaries of the Generated Magnetic Field:

The magnet of the present invention uses an arcuate steel yoke construct of roughly rectangular cross section, as shown by FIG. 5, to define the boundary conditions of the magnetic field; and uses the electrically-joined array of mirror-symmetric coils having bedstead shaped ends (preferably in the structural design illustrated by FIG. 4 herein) not only to generate the magnetic field within the yoke's interior, but also to confine the generated magnetic field to the intended or desired volumetric size limits. The boundary confined and volume limited magnetic field can then be efficiently applied to the ribbon ion beam then traveling through the center of the magnet.

It will be noted in the cross-sectional view of FIG. 5, that as the traveling ribbon ion beam enters the spatial gap 150 within the arcuate yoke construct and passes through the approximate center of the bending magnet, the ribbon ion beam 100 occupies a volumetric zone which is substantially rectangular in cross-sectional appearance. The magnetic field generated by the bedstead shaped coils 120 and 121 acting together within the interior space of the arcuate steel yoke construct 110 is substantially uniform over and across the spatial gap distance through which the volumetric zone 100 of the beam passes.

Also as shown by FIG. 5 in cross-sectional view, assuming the long (height) axis of the traveling ribbon ion beam to be vertical, the top and bottom ends of this beam-containing volumetric zone 100 are limited and are bounded by the surrounding steel top and bottom walls 140 and 141 of the arcuate yoke construct 110. In a similar fashion, the vertical sidewalls 160 and 161 of this beam-containing zone are also further limited in size and are bounded by the girth or thickness of each bedstead shaped coil in the aligned array. Lastly, the outside boundaries 130 and 131 of the coils 120, 121 lie uniformly in parallel within the vertical sidewalls 160, 161 of the arcuate steel yoke; and, for both convenience and economy, are located in close proximity to them. This structural geometry is known to produce a desirably uniform magnetic field. In addition, a set of vacuum walls 170 may exist within the region of uniform magnetic field; and these are formed of non-magnetic material such as aluminum.

The Boundary Conditions for Generating a Uniform Magnetic Field:

The boundary conditions required to generate a uniform field in a rectangular region, such as is shown by FIG. 5, are well known. At the steel yoke limit, the B field must be normal to the surface; so where steel bounds the rectangular gap space and passageway at the top and bottom ends, the direction of the magnetic field is defined. The boundary condition at the edge of the coil conductor is more complicated, but the Maxwell curl equation can be locally reduced to $$\frac{\partial B_y}{\partial x} = \mu_0 J_z$$

and a valid solution is a constant field $B_y$ in the region bounded by the conductors, and a linear decrease of $B_y$ as a function of x to zero within the conductor. (This uses a coordinate frame in which the beam is traveling in the z direction, the magnetic field is generally in the y-direction, and the x-direction is orthogonal to both).

C. The Precisely Positioned and Angle Oriented Segments of the Bedstead Coils

At both the entrance and exit sites of the arcuate steel yoke, each of the loop-shaped coils 120 and 121 lies extended and inclined at each rounded end into the curved configuration known in the technical jargon as a 'bedstead end', or sometimes a "saddle-coil". This 'bedstead end' configuration is best illustrated and easiest understood with reference to FIG. 6.

The arrows appearing within FIG. 6 indicate the direction of electric current flow. Two individual bedstead coils are illustrated, each of which lie in mirror symmetry to the other as an aligned array which encompasses the midplane axis through which the curved beam passes.

Each closed loop of each conductive coil 120, 121, as shown in FIG. 6, preferably (but not necessarily in all instances and embodiments) comprises over one hundred turns of conductive wire which: are wound to fit into and be supported by a ferromagnetic curved sidewall of the arcuate yoke structure; extend orthogonally from the ferromagnetic curved yoke sidewall (or if not curved, approximate this condition); and are electrically connected in sequential series. The placement for each conductive segment in sequential series as a set forming the closed loop of the coil also preferably, but not invariably, is at the following individual fixed positions and angle orientations relative to the mid plane of the curvilinear beam axis and intended beam pathway:

a $1^{st}$ curved segment lying generally parallel to the curved segment of the beam axis, tangential to the midplane of the beam axis;

a $2^{nd}$ curved segment bending about 90° degrees away from the midplane of the beam axis;

a $3^{rd}$ curved segment of 180° arching across the beam axis (which could be further divided into two 90 degree arcs with a straight section of conductor between them);

a $4^{th}$ curved segment of 90° angle lying generally parallel to the $2^{nd}$ segment;

a $5^{th}$ curved segment lying parallel to the curved beam axis segment and opposite to the $1^{st}$ segment;

a $6^{th}$ segment bending 90° away from the midplane of the beam axis;

a $7^{th}$ segment arching back through 180° across the beam axis; and a $8^{th}$ segment turning 90° and connecting to the commencement of the $1^{st}$ segment.

Some additional small straight coil segments may be added and can exist between the curved segments. Also, in some instances and formats, a curved segment may be replaced by a somewhat differently shaped segment, but the preceding description defines the orientation pattern and positional structure of the bedstead coils comprising the present invention.

D. Major Benefits and Unexpected Advantages Provided by the Bedstead Coil Configuration of the Conductive Arrays:

The bedstead configuration, the two inclined rounded ends found at each of the loop-shaped coils in the paired array, in combination with the high aspect ratios of the ribbon ion beam and the rectangular cross section of the coils, are essential structural features of the present invention and achieve several desirable goals concurrently. These include:

(1) The current flowing across the two inclined rounded ends of each bedstead coil in the paired array replaces the current that flowed around the outside of the yoke in the previously described (Nissin) prior-art system; and this change avoids the generation of a 'naked' magnetic dipole.

(2) The absence of a 'naked' magnetic dipole, in turn, causes a dramatic reduction in the magnetic field existing at a distance from outside the structure. The outside magnetic field from a 'naked' dipole falls with the cube of the distance; in comparison, the outside magnetic field extending from the present invention, while a dipole field within the interior of the yoke, does not behave as a dipole with regard to the concomitantly generated 'fringe field'. Instead, the outside magnetic field appears as a much weaker sextupole, and the fringe field therefore falls in accordance with the fifth power of the distance.

(3) The electrical current flowing in the two inclined rounded ends of each bedstead coil configuration, extending away from the midplane of the yoke, controls the magnetic potential distribution; and thereby creates a smooth but rapid drop in the fringe field, confined to the area occupied by the beam.

(4) The total number of ampere turns required for both loop-shaped coils in the mirror-symmetrical paired array (or if subdivided, for all the conductive coils) is determined in all cases by the magnetic gap, the radius of the path along which the ions are deflected, and the mass and energy of the ions.

(5) The magnetic field generated internally within the enclosed spatial region (of rectangular cross-section) can be intrinsically highly uniform up to the limiting boundaries imposed by the steel yoke construct and the two loop-shaped coils in the paired array. The steel surfaces of the yoke walls provide a volumetric boundary to which the magnetic B-field is perpendicular. Also, the boundary provided by the pair of loop-shaped coils is one that allows a uniform field to exist tangential to the boundary in the desired direction, thereby utilizing the entirety of the bounded region within the yoke interior for the magnetic field.

(6) Note also that the fringe field is short. Since the focal properties of bending magnets reside both in the main field and the fringe field, control of the fringe fields is important. This is fully described in the Enge article in the Septier reference cited above, as well as in the manual of the TRANSPORT code cited herein.

(7) In order to maintain good quality focusing, and thereby achieve a high aspect ratio in the output beam for resolving power and efficiency of use, aberrations must be controlled. This may require a slight shaping of the field distribution, which can be performed in accordance with well-established methods exemplified by the software program TRANSPORT.

Such control of the field distribution can involve making the magnetic field deliberately non-uniform by shaping the cross-sectional appearance of the steel yoke to deviate from a simple rectangle form, and modifying the placement of the conductors to shape the current distribution. Such perturbations of the otherwise uniform field can be small.

(8) The use of configured bedstead coils joined together allows the manufacturer to reduce by half the amount of steel required in the sides of the magnetic yoke. This marked reduction arises through the elimination of the fringe field outside the steel yoke in regions other than the entry and exit paths of the ion beam; and the consequent elimination of the steel required to carry this flux without saturation.

(9) In the preferred construction shown in FIG. 4, there is a negligible magnetic field outside the steel yoke construct, unless the steel yoke is magnetically close to saturation. Attention is directed to Prior Art FIG. 7a which illustrates the high external field in the (Nissin) prior art magnet design; and in comparison, to FIG. 7b, which shows how the configured structural design of the present magnet assembly eliminates the fringe field, except in the beam pathway. Note that in both FIGS. 7a and 7b the magnitude of the external field is illustrated by contour lines set at equal intervals of flux density.

Major Differences and Distinctions of the Present System in Comparison to Prior Art Magnets Having Bedstead Coils:

(a) It should be noted and appreciated that the present analyzer magnet structure comprising bedstead coils is markedly different and distinct from those superficially similar magnet formats which are conventionally known and previously used in the prior art. As merely an illustrative example of such substantive differences, attention is directed to U.S. Pat. No. 6,403,967 B1 of Chen et al., which describes an analyzer magnet comprising bedstead coils. This Chen et al. analyzer magnet also incorporates a secondary pair of coils as part of its requisite structure.

As disclosed therein, the motivation for the Chen et al. structure is to provide a magnet having a strongly non-uniform magnetic field; and to provide the magnet with an element of control to adjust the non-uniformity. The Chen et al. invention is thus concerned primarily with maintaining space-charge compensation in extremely high perveance beams. It is noteworthy also that the aspect-ratio of the ion beam in the Chen et al. invention is not explicitly discussed, but is illustrated as being unity. There is therefore no requirement in this Chen et al. magnet that it achieves uniformity of current density; or achieves a high aspect-ratio; or achieves a particularly large pole gap as a fraction of the bending radius. To the contrary, the bedstead coils in the Chen et al. magnet are said to have a cross-section with an aspect-ratio near unity.

(b) By contrast, the present invention is specifically structurally designed to produce a substantially uniform field, across a large gap which can have narrow width—i.e., with a very high aspect-ratio, or an arbitrarily large width. The use of bedstead coil shaped conductive arrays controls the shape of the fringe field in the beam path, keeping it short, smooth and correctly oriented. This feature and functional capability allows the intrinsic aberration existing within the present system to be very small; and even this small degree of aberration may be controlled by means of a slight non-uniformity, which may be incorporated as part of the overall system design, since this need amount to no more than 1 or 2% variation across the cross section of the beam.

The present invention can achieve this uniformity of field for beams whose final dimensions are comparable with the bend radius, and whose size within the magnet exceeds 50% of the bend radius. While the innovation exploits a very simple 2D solution of Poisson's equation to generate a uniform field, the use of conductive coil arrays having bedstead ends constitutes an unexpected and unforeseen improvement that makes high mass resolution possible for a high aspect-ratio beam and beam channel.

Indeed, although one preferred embodiment of the present invention has a beam channel with a cross section having an aspect ratio of about 4:1, there is no obstacle to increasing the aspect-ratio of the beam channel to arbitrarily high numbers. In contrast, the conventional H- and C-cored magnets cannot be used effectively for beams with an aspect ratio substantially greater than 1, unless the long beam dimension is orthogonal to the magnetic field [i.e., the arrangement disclosed and used in U.S. Pat. Nos. 5.350,926 and 5,834,786]; and these prior art formats cannot achieve in a single magnet structure both high resolving power and high aspect ratio in a substantially parallel beam.

E. Ion Optical Properties of the Present System

It is desireable to have the analyzer magnet provide little or no focusing in the long direction over the cross-sectional area of the beam; but instead, provide a good quality focus in the bending plane. At this focus, the beam can be passed through a slot, which can stop unwanted beamlets in the normal manner of mass analysis systems. The resolving power is the ratio of the mass dispersion to the width of the slot, provided that the width of the beam focus is less than the width of the slot. The achievable resolving power is determined by the quality of the focus.

F. Other System Features and Capabilities Provided by This 1st Preferred Embodiment 1. An additional feature offered by the present invention is the use of an ion source which is substantially smaller than the beam's final dimensions to generate the ribbon beam; and the allowing of this ribbon beam to expand continuously in its longer dimension as it passes through the magnet. FIG. 4 shows the small beam generated by the ion source (1) passing through the system and expanding to form a large parallel ribbon beam.

2. In the dispersive direction, the magnet in the system of the present invention causes the focusing of the beam to a waist. In this manner, the aspect-ratio of the beam at a plane downstream of the magnet can have a very high value, often exceeding 40; and the placing of a beam selection aperture at this point (not shown) can achieve high resolving power (60 or greater).

3. Also, a quadrupole lens of modest field, but large aperture, can optionally be used to reduce the divergence of this beam in the long direction to a small fraction of 1 degree, since it is desirable to minimize variation of the incident angle of the ion beam from point to point of the implanted substrate. As shown by FIG. 4, an open-ended Panofsky quadrupole lens is used for this purpose.

4. Moreover, as an alternative to the quadrupole lens, a sector magnet or other ion optical device may be used; but the quadrupole lens is deemed to be the simplest and most cost-effective approach. This aspect of the present invention will cause a further reduction of about 30% in the weight and power requirements over conventionally known prior art systems. This weight reduction is in addition to the weight saving benefit discussed previously above.

G. Overall Design Parameters for the System

When designing an analyzer magnet according to the present invention, it is very desirable to use conventional methods of design to remove and/or avoid most of the second-order aberration from the system. These conventionally known methods include: controlling the inclination and curvature of the effective field boundary at the entrance and exit of the magnet; and controlling the slight non-uniformity of the field in the center of the magnet.

It is possible to design a magnet according to the present invention to have a field index; however, if large, this may add to the cost of the coil manufacture by requiring different proportions for different parts of each coil. Satisfactory control of aberrations is possible by small modifications to the nominally flat top and bottom pole pieces, and by shaping the entrance and exit of the yoke steel.

IV. Construction of a Second Preferred Embodiment for Implanting Flat Panel Displays:

This following description of the second preferred embodiment may be better appreciated by reference to FIGS. 4, 5, and 6 respectively.

The Analyzer Magnet:

The magnet described herein develops a field of 0.25 T, which is sufficient to analyze a 100 keV beam of $P^+$ ions using a design bend radius of 1.0 m. It is presumed that the bending plane is horizontal, and that the long axis of the ribbon ion beam is oriented in the vertical direction. Implantation is accomplished by passing target workpieces (flat glass panels) horizontally through the beam at a pre-chosen target plane. However, the system may be readily mounted in different orientations, and no limitation or restriction as such exists as to relative positioning or orientation.

In a preferred instance, the desired height of the beam is 800 mm at the implant plane. To reduce the required height of the magnet, the beam is created from a relatively small ion source, about 100 mm tall; and this beam diverges and expands horizontally and vertically on its pathway through the magnet.

A generally available type of ion source is to be employed in the system [one common example is described by U.S. Pat. No. 5,834,786, which is expressly incorporated by reference herein].

The long axis of the source extraction slit lies in the vertical direction. The magnet provides little or no focusing in the vertical direction (although it would be possible to modify its shape to provide such focusing). The magnet vertical gap must clear the beam generously; and this typically requires a gap of about 600 mm.

An Optional Quadrupole Lens:

Since a parallel beam may be required by the system for implantation of the workpiece, a quadrupole lens of simple construction, as described more fully below, is optionally provided.

In order to achieve a resolving power of 60, the width of the beam must be less than about 10 mm at the resolving aperture. The beam from the ion source is assumed to diverge horizontally by at least +/−40 mrad; and the analyzer magnet is required to focus the beam to meet the stated constraints. The quadrupole lens itself is located at or close to this plane in order to reduce its required dimensions and power requirements.

Given these general constraints, the construction of the second preferred embodiment of the magnet can be more fully presented.

The Construction:

The required field of 0.25T and the magnetic gap of 600 mm require approximately 60,000 ampere turns per conductive array to develop the required field. Two bedstead coils aligned in mirror-symmetry and forming a paired array as shown in FIG. 6 are provided, and the paired coils of the array are in physical contact with each other at the midplane axis. Each coil is wound using square hollow conductor of about 1 cm cross section, with 30 layers of 7 turns in each coil segment. The average current density is about 200 A per sq. cm.

In the central region of the analyzer magnet, the structural arrangement has a cross section as shown in FIG. 5. In the internal spatial region bounded by the coils 120 and 121 and by the top and bottom walls 140, 141 of the steel yoke 110, a highly uniform magnetic field is produced, which is oriented vertically. The traveling ion beam occupies a central position within the spatial gap 150 of this bounded region, and the beam is deflected through a total of 90 degrees.

Surrounding the traveling beam is a vacuum housing 170, such that the conductive coils and yoke may be located outside the vacuum region, while the ion beam itself travels in a zone of high vacuum. For this purpose, the walls of the vacuum housing or vessel must be non-magnetic.

The two inclined rounded ends of each bedstead coil in the paired arrays are formed using commercially available manufacturing techniques. At each inclined rounded end, the set of conductor segments in series provide a bend of approximately 90 degrees, with as sharp a radius on the inside of the bend as the manufacturing technique permits;

then the segments are bent sideways through 180 degrees; and then finally are bent again in the reverse direction through 90 degrees to return to the segments lying on the opposite side of the coil loop.

Aberration Control:

The shape of the fringe field at the entrance and exit of the analyzer magnet is important for good beam focusing. The fringe field will decrease in strength smoothly but quickly, from its full value to less than 10% in about 0.5 meters; and continue quickly to fall to near zero value.

The field contours will not exhibit excessive curvature in the beam path, but are quickly truncated elsewhere. It can be seen from FIG. 7b that the shape of the magnetic fringe field, under the control of the bedstead ends of the coils, conforms admirably to these requirements. There is an integral known as "K1", used and defined by Karl Brown in the program TRANSPORT and described in CERN publication 80-04, which quantifies the focal properties of a fringe field; a larger number for K1 represents a long field. Numbers below 0.5 are generally considered good. The K1 value for the fringe field shown is about 0.3.

As well described in the published scientific literature, it is generally difficult to control second-order aberrations in magnets whose spatial gap exceeds 0.25 of the bend radius. In the present second embodiment, the spatial gap is 0.6 of the bend radius, yet these aberrations are well controlled. Two second order effects thus are important: (1) the tendency for inner and outer ion trajectories to be bent through too great an angle; and (2) the tendency for the beam to be bent into a 'smile' shaped distortion at the resolving aperture.

These second order effects can be attenuated by introducing small sextupole components into the magnetic field, following the technique of Brown and Enge (as cited above). The shape of the top and bottom surfaces of the yoke at both the entrance and exit sites may be curved; and the transverse profile of the top and bottom walls of the yoke steel may be curved. The calculations required are well-known, but calculating these small corrections to have the correct and appropriate magnitude in the present invention requires the use of finite-element modeling of the field and of ion trajectories. This modeling can be accomplished by using the Vector Fields' OPERA and TOSCA software programs.

Collimation of the Ions in the Beam:

The beam is collimated by a lens prior to being used to implant the workpiece. For the process to be uniform for amorphous or polycrystalline substrates (such as glass), it is not necessarily required that the angular spread within the beam be very low; but it is required that the spread of angles and the orientation of the centroid do not vary across the surface of the substrate. This can be accomplished by means of a quadrupole lens.

The preferred quadrupole lens 200 shown in FIG. 4 is of simple construction. It is based on a 'Panofsky' quadrupole lens as described by Banford [in The Transport of Charged Particle Beams, Spon, 1960]; but because the beam aspect-ratio is so large, the short steel legs of the quadrupole's yoke and their corresponding coil windings are all omitted. Thus modified, the quadrupole lens 200 comprises of a pair of steel bars, rectangular in cross section, on either side of the beam; and around each bar is wound a coil of wire ~750 mm long, sufficiently long to extend just above and below the top and bottom of the ribbon beam.

Current Density:

The uniformity of the current density in the beam controls the uniformity of the ion dose to be implanted in the workpiece. The uniformity may be controlled by using the conventional techniques described in U.S. Pat. Nos. 5,834,786 and 5,350,926; or by using methods described elsewhere in the relevant patent literature. For this purpose, a multipole lens or its equivalent is placed around the beam downstream of the magnet.

V. A Third Preferred Embodiment Intended for Use as a Single-Wafer Ion Implanter for Silicon Wafers A Third Preferred System Design:

An ion beam is emitted from an ion source slot 100 mm tall and 5 mm wide, and travels in a horizontal direction as a diverging ribbon ion beam. The ion source slot is convex, generating a controlled linear divergence in the ion beam of +/−2.5 degrees.

The traveling ribbon ion beam enters a windowframe magnet comprising: two bedstead coils paired in mirror symmetry as an aligned array; a spatial passageway for the beam as it passes between oppositely positioned conductive segments of the two loop-shaped coils of the array, and a steel yoke construct which is bounded at top and bottom by steel poles attached to the yoke structure. The steel poles are tapered over their length to provide a clearance of about 15 mm above and below the beam as it travels through the spatial passageway while expanding vertically, as shown in sequence in FIGS. 8a, 8b, and 8c respectively. In addition, the steel poles are contoured to control the shape of the magnetic field generated by the magnet and to minimize system aberrations.

The individual looped shaped coils forming the paired array (as they surround the beam passageway) have a uniform cross-section of about 100 mm×130 mm. Because the tapered steel poles do not conform to the parallel planes presented and defined by the inner and outer coil segments, the shape of the pole surface must be optimized using finite-element modeling to control aberrations in the beam. However, the magnitude of this correction is far less than is the case with planar magnet coils conventionally used in ion implantation equipment.

Fabrication of a Vacuum Region:

For convenience of fabrication, the loop shaped coils are of uniform size in cross-section, yet the steel pole surfaces must provide and encompass a tapering spatial gap. Therefore, the vertical gap distance existing between the top and bottom walls of the steel yoke structure is at some locations greater than the height of the coil portions defining and bounding the spatial gap—and also, at some locations, is markedly smaller. At the outer edges of the spatial region bounding the traveling beam—particularly between the beam and the inner and outer conductive portions forming the coil loop or oval—vacuum walls composed of non-magnetic material are required to separate the ion beam (which must be held in high vacuum) from the coils (which are typically outside the vacuum zone for convenience).

In the region where these vacuum walls meet and join, the steel material at that location is a transition from that part of the steel matter which functions and serves as a magnetic pole (North or South), encompasses the coils, and provides a return path for the magnetic flux. A fabrication step must occur during which the tapered pole part of the steel is joined to the non-tapered part of the return yoke, which encompasses the coil segments bounding the sides of the beam path. This is illustrated by FIG. 8 as a whole.

Figure 8A:
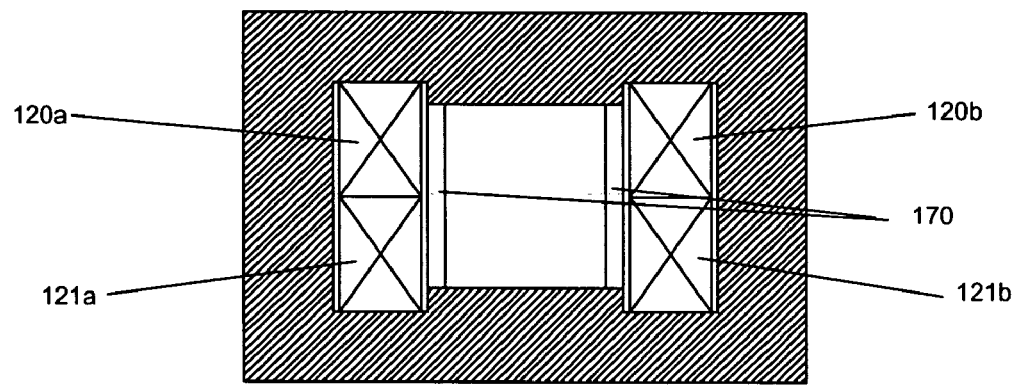
FIGS. 8a–8c respectively show cross-sectional views at three stages along the beam path through a tapered magnet according to the present invention for an expanding ribbon ion beam.
Figure 8B:
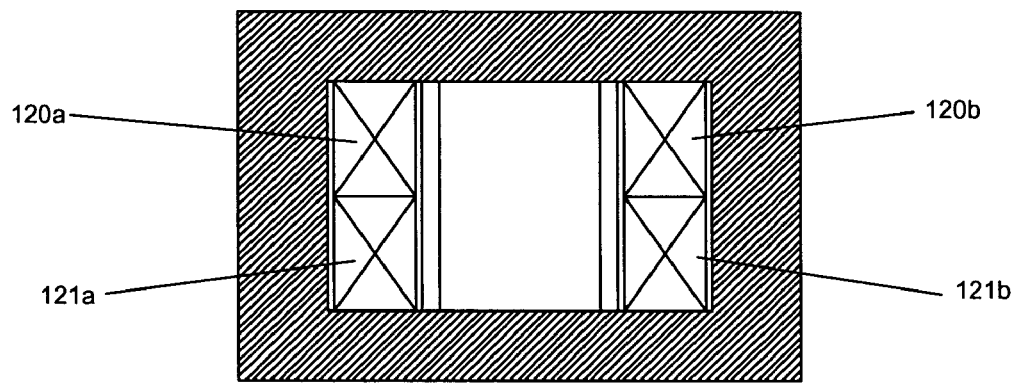
Figure 8C:
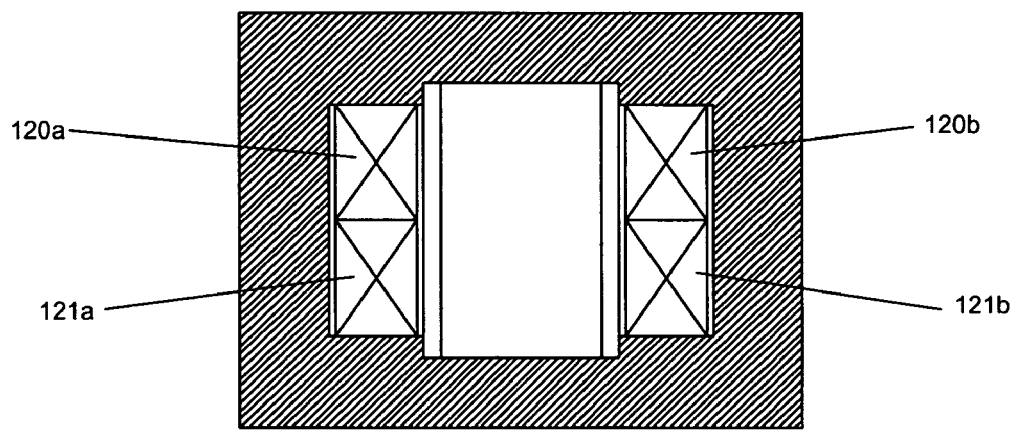

This type of fabrication and structural shaping involves a compromise: the goal of good field uniformity being incompatible with making the pole conform to the expanding beam. However, it is possible to arrange for the magnitude of the distortions in the part of the magnet with the narrower gap to cancel approximately the distortions where the gap is wider; and also to make further optimizations using finite-element models, in order to arrive at a satisfactory compromise shape which can be fabricated. The field distortion caused by the fabricated shape shown in FIG. 8a is opposite to that shown in FIG. 8c; and, with care, this effect permits the effect of the field distortion on the beam to be controlled.

A Focusing Lens:

The beam exits the analyzer magnet, after having grown to about 240 mm in the vertical direction, and will continue to diverge. However, the beam initially diverged at +/−5 degrees on entering the magnet; and the optics of the magnet now have caused the beam to converge at +/−2.5 degrees to generate a line focus at a downstream location at which the beam is 340 mm tall and less than 20 mm wide. A resolving aperture placed at this location thus allows a high resolving power to be achieved.

A multipole lens is located just downstream (or alternatively just upstream) of the analyzer magnet; and this multipole lens can be adjusted to control the vertical uniformity of the ribbon beam.

Desirably, a second multipole lens is also located close to the resolving aperture. Its purpose is primarily to function as a quadrupole lens as described previously herein and to focus the trajectories in the beam to be quasi-parallel in the vertical direction. For this purpose, the same current is required to be passed through all the coils in this second multipole lens. It is possible to make small adjustments to the current in individual coils for the purpose of correcting the trajectory angles in the beam if uniformity adjustments have made them vary in a non-monotonic fashion across the height of the beam.

Overall Design Parameters for the System

The system of the present invention typically comprises an ion source emitting a divergent ribbon ion beam; and an analyzer magnet to bend the ribbon beam through an angle preferably between about 60 and 110 degrees along a curved path. The analyzer magnet is preferably a windowframe dipole magnet with bedstead-shaped conductive coils, but the ferromagnetic sidewalls of the yoke bounding the long axis of the ribbon beam have a tapered spatial gap, whereby the ion beam is allowed to continue diverging in size as it is bent in travel direction. Since the magnetic field is inversely proportional to the gap between the sidewalls of the yoke, the radius is not constant, and decreases somewhat as the spatial gap increases.

For a large spatial gap within the yoke, the number of ampere turns required is large; and the power consumed can become a significant fraction of the total power consumption of the implantation system. This tapered sidewall yoke arrangement makes for the most efficient use of the available ampere turns. This can be combined with a focusing device, such as an open-ended Panofsky quadrupole lens, to generate a ribbon ion beam of greater than 300 mm height suitable for implanting 300 mm wafers in a compact beamline. There is yet a further saving of weight and power over conventionally known prior art systems.

Capabilities and Functions of This 3$^{rd}$ Preferred System:

Accordingly, by means of the above system arrangement, all the following can be accomplished:

(a) A ribbon beam is generated from an ion source of economical proportions, here 100 mm;

(b) The beam is expanded to the required final size, here >300 mm tall;

(c) The beam is mass-analyzed to obtain a pure beam, with a resolving power of at least 20, and in most cases at least 60;

(d) The angular divergence within the beam is reduced to a low level;

(e) The uniformity of the ion beam can be controlled from top to bottom; furthermore parasitic increases in beam divergence caused by the uniformity multipole can be partially removed by the second multipole.

(f) The variation in angular divergence from top to bottom can be minimized and controlled;

Using this preferred system, and by virtue of these capabilities, one can implant 300 mm silicon wafers by passing them horizontally at constant velocity through the ion beam.

The present invention is not to be limited in scope nor restricted in form except by the claims appended hereto:

What we claim is:

1. A high resolution magnetic analyzer for separating unwanted ion species from a traveling ribbon ion beam, said high resolution magnetic analyzer comprising:

a central axis and intended arc pathway for a ribbon ion beam as it travels, said central axis having a predetermined curvilinear shape, an arc with a radius ranging between about 0.25 and 2 meters, and a fixed angle of curvature ranging from not less than about 45 degrees to not more than about 110 degrees of curvature;

an arcuate yoke construct encompassing said predetermined curvilinear central axis and surrounding said intended arc pathway for the continuous ribbon ion beam as it travels, said arcuate yoke construct being formed at least in part of a ferromagnetic material and comprising an arcuate wall structure having fixed dimensions and substantially rectangular cross-section, two discrete open ends which serve as an entrance and exit for the traveling beam, and an internal spatial region of determinable volume which serves as a spatial passageway for the traveling beam;

a mirror symmetrical pair of loop-shaped coils set in parallel as an aligned array, (a) wherein each discrete coil of the pair in the aligned array (i) is an elongated complete loop comprised at least in part of electrically conductive material, (ii) is an elongated complete loop having two rounded and inclined loop ends, each of which is bent in the same direction, and (iii) is an elongated complete loop formed as a set of multiple conductive segments placed in sequential series wherein each segment is fixed at a pre-chosen sequence position and individual angle orientation with respect to said central axis and intended arc pathway for the ribbon ion beam as it travels within said internal spatial region of said arcuate yoke construct, and (b) wherein the aligned array of two looped-shaped coils paired in mirror symmetry (iv) presents a bend direction for the two rounded inclined ends of one looped-shaped coil which is opposite to the bend direction for the two rounded inclined ends of the other looped-shaped coil in the array, (v) provides a central open spatial channel via the cavity volume of the closed loop in each of the two coils, said central open spatial channel extending from each of said inclined loop ends to the other over the linear dimensional distance of the array, (vi) is positioned within said internal spatial region along the interior surfaces of two opposing walls of said arcuate yoke construct such that one pair of aligned rounded inclined loop ends extends from and lies adjacent to each of the two open ends of said arcuate yoke construct, (vii) serves as limiting boundaries for said curvilinear central axis and intended arc pathway for the continuous ribbon ion beam as it travels in the gap space existing between said two loop-shaped coils positioned within said internal spatial region of said arcuate yoke construct.

2. The high resolution magnet as recited in claim 1 further comprising means for supplying an adjustable electrical current to each loop-shaped coil in the pair of the aligned array, the electric current circulating in the same direction for each loop-shaped coil.

3. The high resolution magnetic analyzer as recited in claim 1 wherein said aligned array of loop-shaped coils lies symmetrically disposed on opposite sides of the midplane in which the curved central axis of the beam lies.

4. The high resolution magnetic analyzer as recited in claim 1 wherein each loop-shaped coil in said aligned array comprises eight connected conductive segments in sequential series including a $1^{st}$ curved segment generally parallel to the curved segment of the beam axis, tangent to the midplane of the beam axis, a $2^{nd}$ curved segment bending away from the midplane of the beam axis, a $3^{rd}$ curved segment arching across the beam axis, a $4^{th}$ curved segment generally parallel to the $2^{nd}$ segment, a $5^{th}$ curved segment parallel to the curved beam axis segment and opposite the $1^{st}$ segment, a $6^{th}$ segment bending away from the midplane of the beam axis, a $7^{th}$ segment arching back across the beam axis, and an $8^{th}$ segment turning connecting to the commencement of the first segment.

5. The high resolution magnetic analyzer as recited in claim 1 wherein each loop-shaped coil in said aligned array comprises eight connected conductive segments in sequential series including a $1^{st}$ curved segment lying generally parallel to the curved segment of the beam axis, tangential to the midplane of the beam axis;

a $2^{nd}$ curved segment bending about 90° degrees away from the midplane of the beam axis;

a $3^{rd}$ curved segment of 180° arching across the beam axis (which could be further divided into two 90 degree arcs with a straight section of conductor between them);

a $4^{th}$ curved segment of 90° angle lying generally parallel to the $2^{nd}$ segment;

a $5^{th}$ curved segment lying parallel to the curved beam axis segment and opposite to the $1^{st}$ segment;

a $6^{th}$ segment bending 90° away from the midplane of the beam axis;

a $7^{th}$ segment arching back through 180° across the beam axis; and a $8^{th}$ segment turning 90° and connecting to the commencement of the $1^{st}$ segment.

6. The high resolution magnetic analyzer as recited in claim 1 wherein said spatial passageway of said arcuate yoke construct is bounded on its two longer dimensional sides by said loop-shaped coils of the array, and on its shorter dimensional sides by two wall surfaces of said arcuate yoke construct.

7. The high resolution magnetic analyzer as recited in claim 1 wherein said means for supplying an electric current is sufficient to generate a substantially uniform magnetic field in the spatial passageway of said arcuate yoke construct, and is effective to bend the ribbon-shaped beam as it passes through said spatial passageway.

8. The high resolution magnetic analyzer as recited in claim 1 wherein said analyzer is effective to deflect the desired ions in the ion beam through a pre-chosen angle of curvature ranging from not less than about 45 degrees to not more than about 110 degrees and to focus the deflected ion beam to a line focus having an aspect ratio of at least 10.

9. The high resolution magnetic analyzer as recited in claim 8 wherein said focused beam is then transmitted through a slot in a resolving aperture, thereby separating the desired ions from contaminant ions of different momentum.

10. The high resolution magnetic analyzer as recited in claim 1 wherein unwanted ion species are separated from a diverging ribbon ion beam by bending the beam through an angle greater than about 45 degrees, the central axis of the ribbon beam being curved as it passes through the midplane of said curvilinear axis.

11. The high resolution magnetic analyzer as recited in claim 10 wherein the separation of the magnetic poles increases along the pathway of the beam and consequently causes the radius of the trajectories to increase along the pathway of the beam.

12. The high resolution magnetic analyzer as recited in claim 11 wherein said magnetic poles are shaped to conform to the shape of the beam as its cross-section changes along its intended travel pathway.

13. The high resolution magnet analyzer as recited in claim 1 wherein said arcuate yoke construct and positioned array of loop-shaped coils together substantially prevent the creation of external fringe fields and wherein such finite fringe fields as emerge from said open ends of said yoke construct are attenuated and confined.

14. The high resolution magnetic analyzer as recited in claim 1 wherein said substantially rectangular cross-section of the arcuate yoke construct is modified by shaping the wall surfaces bounding the magnetic field so as to modify the focal properties, whereby the aspect ratio of the line focus in the beam is increased.

15. The high magnetic analyzer as recited in claim 1 wherein the substantially rectangular cross-section of the arcuate yoke construct is modified by shaping the wall surfaces bounding the magnetic field so as to modify the focal properties, whereby its curvature is reduced.

16. An ion implanter apparatus for implanting a workpiece with ions from a ribbon-shaped beam, said ion implanter apparatus comprising:

a slotted ion source;

an ion beam exiting from said source which diverges in two orthogonal dimensions;

a high resolution magnetic analyzer for separating unwanted ion species from a traveling ribbon ion beam, said magnetic analyzer comprising:

a central axis and intended arc pathway for a ribbon ion beam as it travels, said central axis having a predetermined curvilinear shape, an arc with a radius between about 0.2 and 2 meters, and an angle of curvature ranging from not less than about 45 degrees to not more than about 110 degrees of curvature;

an arcuate yoke construct encompassing said predetermined curvilinear central axis and surrounding said intended arc pathway for the continuous ribbon ion beam as it travels, said arcuate yoke construct being formed at least in part of a ferromagnetic material and comprising an arcuate wall structure having fixed dimensions and substantially rectangular cross-section, two discrete open ends which serve as an entrance and exit for the traveling beam, and an internal spatial region of determinable volume which serves as a spatial passageway for the traveling beam;

a mirror symmetrical pair of loop-shaped coils set in parallel as an aligned array,
  (a) wherein each discrete coil of the pair in the aligned array
    (i) is an elongated complete loop comprised at least in part of electrically conductive material,
    (ii) is an elongated complete loop having two rounded and inclined loop ends, each of which is bent in the same direction, and
    (iii) is an elongated complete loop formed as a set of multiple conductive segments placed in sequential series wherein each segment lies at a pre-chosen sequence position and individual angle orientation with respect to said central axis and intended arc pathway for the ribbon ion beam as it travels within said internal spatial region of said arcuate yoke construct, and
  (b) wherein the aligned array of two looped-shaped coils in mirror symmetry
    (iv) presents a bend direction for the two rounded inclined ends of one looped-shaped coil which is opposite to the bend direction for the two rounded inclined ends of the other looped-shaped coil in the pair,
    (v) provides a central open spatial channel via the cavity volume of the closed loop in each of the two coils, said central open spatial channel extending from each of said inclined loop ends to the other over the linear dimensional distance of the array,
    (vi) is positioned within said internal spatial region along the interior surfaces of two opposing walls of said arcuate yoke construct such that one pair of oppositely inclined loop ends extends from and lies adjacent to each of the two open ends of said arcuate yoke construct, and
    (vii) serves as limiting boundaries for said curvilinear central axis and intended arc pathway for the continuous ribbon ion beam as it travels in the gap space between said two loop-shaped coils positioned within said internal spatial region of said arcuate yoke construct;

means for supplying an adjustable electrical current to each loop-shaped coils in the pair of the aligned array, the electric current circulating in the same direction for each loop-shaped coil;

a resolving aperture into which said beam is introduced, from which the desired beam emerges converging in its shorter dimension to a line focus, and through which the line focus containing the desired fraction of said ion beam is transmitted, but which intercepts unwanted ions; and a lens to reduce spatial variation in divergence and direction from the beam.

17. The ion implanter apparatus as recited in claim 16 further comprising:
an ion source generating a ribbon ion beam which diverges in both horizontal and vertical directions;
a high resolution analyzing magnet which focuses the ion beam across its narrow dimension to a line focus, but allows the beam to continue to diverge in its longer dimension;
a resolving aperture through which the focused beam is transmitted, but which blocks unwanted beam contaminants;
a lens capable of producing a quadrupole field of desired strength which focuses the beam by a small amount in its longer dimension, thereby rendering the trajectories approximately parallel; and
means of traversing workpieces through the approximately parallel ion beam in the direction of its narrow dimension at a velocity effective to implant a desired does of ions into the workpiece.

18. The ion implanter apparatus as recited in claim 16 further comprising a multipole lens whose magnetic field gradient can be adjusted to control the uniformity of the ribbon-shaped ion beam.

19. A method of generating a mass-analyzed continuous parallel ribbon beam, said method comprising the steps of
producing a ribbon ion beam diverging in two dimensions from a slot in an ion source of dimensions substantially smaller than the desired parallel ribbon beam;
deflecting the ion beam through an angle between about 45 and 110 degrees by means of a high resolution magnetic analyzer comprising
  a central axis and intended arc pathway for a ribbon ion beam as it travels, said central axis having a curvilinear shape, an arc with a radius between about 0.2 and 2 meters , and an angle of curvature ranging from not less than about 45 degrees to not more than about 110 degrees of curvature;
  an arcuate yoke construct encompassing said predetermined curvilinear central axis and surrounding said intended arc pathway for the continuous ribbon ion beam as it travels, said arcuate yoke construct being formed at least in part of a ferromagnetic material and comprising an arcuate wall structure having fixed dimensions and substantially rectangular cross-section, two discrete open ends which serve as an entrance and exit for the traveling beam, and an internal spatial region of determinable volume which serves as a spatial passageway for the traveling beam;
  a mirror symmetrical pair of loop-shaped coils set in parallel as an aligned array,
    (a) wherein each discrete coil of the pair in the aligned array
      (i) is an elongated complete loop comprised at least in part of electrically conductive material,
      (ii) is an elongated complete loop having two rounded and inclined loop ends, each of which is bent in the same direction, and
      (iii) is an elongated complete loop formed as a set of multiple conductive segments placed in sequential series wherein each segment lies at a pre-chosen sequence position and individual angle orientation with respect to the central axis and intended arc pathway for the ribbon ion beam as it travels within said internal spatial region of said arcuate yoke construct, and (b) wherein the aligned array of two looped-shaped coils in mirror symmetry (iv) presents a bend direction for the two rounded inclined ends of one looped-shaped coil which is opposite to the bend direction for the two rounded inclined ends of the other looped-shaped coil in the pair, (v) provides a central open spatial channel via the cavity volume of the closed loop in each of the two coils, said central open spatial channel extending from each of said inclined rounded loop ends to the other over the linear dimensional distance of the array, (vi) is positioned within said internal spatial region along the interior surfaces of two opposing walls of said arcuate yoke construct such that one pair of oppositely inclined loop ends extends from and lies adjacent to each of the two open ends of said arcuate yoke construct, (vii) serves as limiting boundaries for said curvilinear central axis and intended arc pathway for the continuous ribbon ion beam as it travels in the gap space between said two loop-shaped coils positioned within said internal spatial region of said arcuate yoke construct;

supplying an adjustable electrical current to each loop-shaped coil in the pair of the aligned array of said magnet analyzer to generate a magnetic field, the electric current circulating in the same direction for each loop-shaped coil.

allowing said magnetic field generated by said magnetic analyzer to focus and converge the beam in a direction orthogonal to the field, while causing minimal focusing in its long dimension, thereby allowing the beam to continue to diverge in its long dimension while being refocused to a line focus at a distance downstream of the magnetic field;

passing the beam through a slot effective to reject unwanted beam components; and passing the beam through a magnetic lens effective to render it parallel within about 1 degree in a plane encompassing its major dimension.

20. The method of generating a mass-analyzed continuous parallel ribbon beam as recited in claim 19 wherein said ribbon ion beam is deflected at about a 90 degree angle of curvature.

21. The method of generating a mass-analyzed continuous parallel ribbon beam as recited in claim 19 wherein said magnetic field generated by said magnet analyzer is efficiently confined to the designated spatial passageway through which the ribbon ion beam passes and which becomes rapidly attenuated outside said designated region.

22. The method of generating a mass-analyzed continuous parallel ribbon beam as recited in claim 19 wherein a large ion beam of high aspect ratio and rectangular cross section is produced.

23. The method of generating a mass-analyzed continuous parallel ribbon beam as recited in claim 22 wherein a beam of at least 800 mm in the longer dimension is produced.

* * * * *

(12) EX PARTE REEXAMINATION CERTIFICATE (10624th)
United States Patent
White et al.

(10) Number: US 7,112,789 C1
(45) Certificate Issued: Jun. 9, 2015

(54) HIGH ASPECT RATIO, HIGH MASS RESOLUTION ANALYZER MAGNET AND SYSTEM FOR RIBBON ION BEAMS

(75) Inventors: Nicholas R. White, Manchester, MA (US); Jiong Chen, San Jose, CA (US)

(73) Assignee: ADVANCED ION BEAM TECHNOLOGY, INC., San Jose, CA (US)

Reexamination Request:
No. 90/012,961, Oct. 2, 2013

Reexamination Certificate for:
Patent No.: 7,112,789
Issued: Sep. 26, 2006
Appl. No.: 11/123,924
Filed: May 6, 2005

Related U.S. Application Data

(60) Provisional application No. 60/571,965, filed on May 18, 2004.

(51) Int. Cl.
- *H01J 37/317* (2006.01)
- *H01J 37/147* (2006.01)
- *H01J 49/20* (2006.01)
- *H01J 37/05* (2006.01)
- *H01J 49/26* (2006.01)
- *H01J 49/30* (2006.01)

(52) U.S. Cl.
CPC ............... *H01J 37/05* (2013.01); *H01J 49/26* (2013.01); *H01J 37/3171* (2013.01); *H01J 49/30* (2013.01)

(58) Field of Classification Search
None
See application file for complete search history.

(56) References Cited

To view the complete listing of prior art documents cited during the proceeding for Reexamination Control Number 90/012,961, please refer to the USPTO's public Patent Application Information Retrieval (PAIR) system under the Display References tab.

*Primary Examiner* — Albert J Gagliardi

(57) ABSTRACT

The present invention provides a windowframe magnet having an aligned array of paired bedstead coils in mirror symmetry can bend a high aspect ratio ribbon ion beam through angle of not less than about 45 degrees and not more than about 110 degrees, and can focus it through a resolving slot for mass analysis. The long transverse axis of the beam, which can exceed 50% of the bend radius, is aligned with the generated magnetic field. The array of paired bedstead coils provide tight control of the fringing fields, present intrinsically good field uniformity, and enable a manufacture of much lighter construction than other magnet styles conventionally in use in the ion implantation industry.

Within the system of the present invention, the ribbon beam is refocused with low aberration to achieve high resolving power, which is of significant value in the ion implantation industry. System size is further reduced by using a small ion source and a quadrupole lens to collimate the beam after expansion and analysis. There is no fundamental limit to the aspect ratio of the beam that can be analyzed.

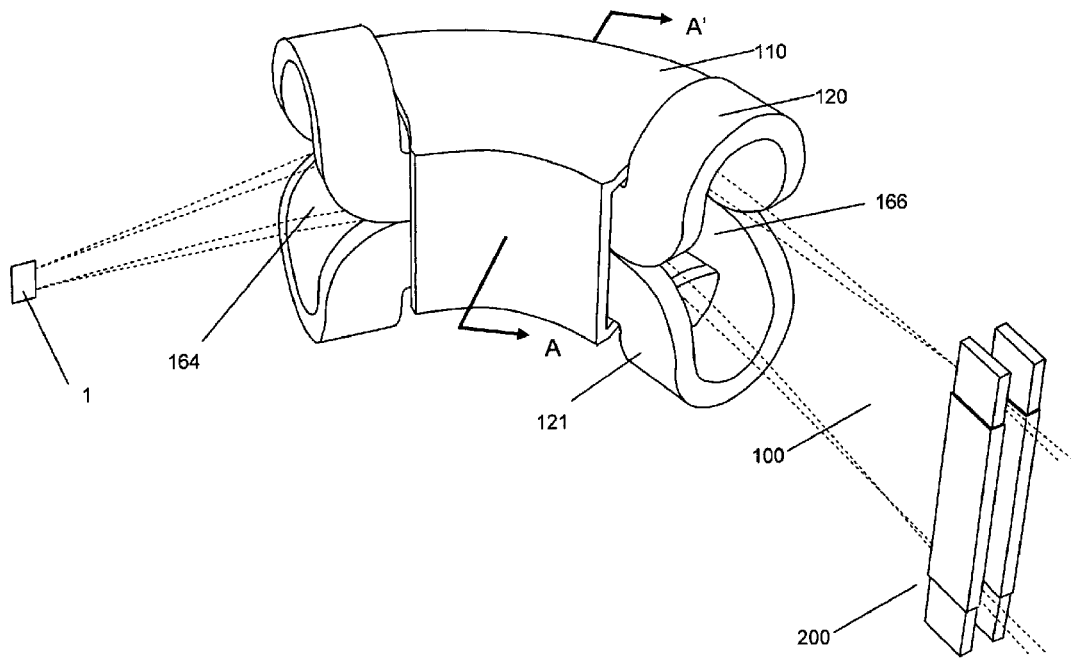

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-23 is confirmed.

\* \* \* \* \*